United States Patent
Sung et al.

(10) Patent No.: US 12,094,997 B2
(45) Date of Patent: Sep. 17, 2024

(54) BSI CHIP WITH BACKSIDE ALIGNMENT MARK

(71) Applicant: Taiwan Semiconductor Manufacturing Co., Ltd., Hsinchu (TW)

(72) Inventors: Chih Wei Sung, Kaohsiung (TW); Chung-Bin Tseng, Tainan (TW); Keng-Ying Liao, Tainan (TW); Yen-Jou Wu, Tainan (TW); Po-Zen Chen, Tainan (TW); Su-Yu Yeh, Tainan (TW); Ching-Chung Su, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/814,726

(22) Filed: Jul. 25, 2022

(65) Prior Publication Data

US 2022/0359781 A1 Nov. 10, 2022

Related U.S. Application Data

(63) Continuation of application No. 16/865,819, filed on May 4, 2020, now Pat. No. 11,430,909.
(Continued)

(51) Int. Cl.
*H01L 31/18* (2006.01)
*H01L 23/544* (2006.01)
*H01L 27/146* (2006.01)

(52) U.S. Cl.
CPC ........ *H01L 31/1876* (2013.01); *H01L 23/544* (2013.01); *H01L 27/14621* (2013.01);
(Continued)

(58) Field of Classification Search
CPC ............... H01L 31/1876; H01L 23/544; H01L 27/14621; H01L 27/14627;
(Continued)

(56) References Cited

U.S. PATENT DOCUMENTS

| | | | |
|---|---|---|---|
| 7,588,993 B2 * | 9/2009 | Liu | H01L 23/544 438/462 |
| 8,227,899 B2 * | 7/2012 | Liu | H01L 23/544 257/E23.179 |

(Continued)

FOREIGN PATENT DOCUMENTS

| | | |
|---|---|---|
| CN | 105633070 A | 6/2016 |
| KR | 20130016015 A | 2/2013 |

(Continued)

*Primary Examiner* — Earl N Taylor
(74) *Attorney, Agent, or Firm* — Slater Matsil, LLP

(57) ABSTRACT

A method includes forming image sensors in a semiconductor substrate. A first alignment mark is formed close to a front side of the semiconductor substrate. The method further includes performing a backside polishing process to thin the semiconductor substrate, forming a second alignment mark on the backside of the semiconductor substrate, and forming a feature on the backside of the semiconductor substrate. The feature is formed using the second alignment mark for alignment.

20 Claims, 21 Drawing Sheets

Related U.S. Application Data

(60) Provisional application No. 62/881,000, filed on Jul. 31, 2019.

(52) U.S. Cl.
CPC .. *H01L 27/14627* (2013.01); *H01L 27/14636* (2013.01); *H01L 27/1464* (2013.01); *H01L 27/14683* (2013.01); *H01L 27/14687* (2013.01); *H01L 31/186* (2013.01); *H01L 31/1888* (2013.01); *H01L 2223/54426* (2013.01)

(58) Field of Classification Search
CPC ........... H01L 27/14636; H01L 27/1464; H01L 27/14683; H01L 27/14687; H01L 31/186; H01L 31/1888; H01L 2223/54426
See application file for complete search history.

(56) References Cited

U.S. PATENT DOCUMENTS

| | | | | |
|---|---|---|---|---|
| 8,318,579 | B1* | 11/2012 | Wu | H01L 23/544 438/69 |
| 8,779,344 | B2* | 7/2014 | Kao | H01L 27/14687 250/208.1 |
| 8,779,539 | B2* | 7/2014 | Kao | H01L 27/14689 257/E31.127 |
| 9,184,207 | B2 | 11/2015 | Lin et al. | |
| 2001/0033033 | A1* | 10/2001 | Yao | H01L 23/544 257/E23.179 |
| 2002/0030290 | A1* | 3/2002 | Hirase | H01L 23/544 257/E23.179 |
| 2007/0207566 | A1* | 9/2007 | Fu | H01L 27/14609 257/E31.02 |
| 2009/0146325 | A1* | 6/2009 | Liu | H01L 21/71 257/E23.179 |
| 2009/0321888 | A1* | 12/2009 | Liu | H01L 23/544 257/E23.179 |
| 2010/0109006 | A1* | 5/2010 | Kobayashi | H01L 24/05 257/776 |
| 2010/0210088 | A1* | 8/2010 | Ishimaru | H01L 27/14687 438/459 |
| 2010/0237451 | A1* | 9/2010 | Murakoshi | H01L 21/76898 257/E31.127 |
| 2010/0244287 | A1* | 9/2010 | Hsu | G03F 7/70633 257/E23.179 |
| 2010/0327392 | A1* | 12/2010 | McCarten | H01L 27/1464 257/447 |
| 2010/0330728 | A1* | 12/2010 | McCarten | H01L 27/1464 257/E31.127 |
| 2011/0084350 | A1* | 4/2011 | Murakoshi | H01L 27/14632 257/E31.127 |
| 2011/0186917 | A1* | 8/2011 | Akiyama | H01L 27/14636 257/292 |
| 2011/0291139 | A1* | 12/2011 | Chiu | H01L 31/048 257/E33.056 |
| 2012/0280351 | A1* | 11/2012 | Liu | H01L 23/544 257/E23.179 |
| 2013/0009268 | A1* | 1/2013 | Testa | H01L 27/1464 257/E31.127 |
| 2013/0037958 | A1* | 2/2013 | Ho | H01L 24/05 257/E23.079 |
| 2013/0069190 | A1* | 3/2013 | Kao | H01L 27/1464 257/E31.127 |
| 2013/0214337 | A1* | 8/2013 | Kashihara | H01L 27/14645 438/34 |
| 2014/0015083 | A1* | 1/2014 | Kao | H01L 27/14689 257/E31.127 |
| 2014/0027873 | A1* | 1/2014 | Kashihara | H01L 27/14607 438/69 |
| 2014/0094016 | A1* | 4/2014 | Liu | H01L 23/544 438/401 |
| 2014/0232013 | A1* | 8/2014 | Wu | H01L 23/528 438/638 |
| 2015/0102445 | A1* | 4/2015 | Testa | H01L 27/14621 257/443 |
| 2015/0249102 | A1* | 9/2015 | Terada | H01L 27/14609 438/73 |
| 2016/0013235 | A1* | 1/2016 | Yee | H01L 27/1464 257/432 |
| 2018/0069044 | A1* | 3/2018 | Kashihara | H01L 27/14627 |
| 2018/0122844 | A1* | 5/2018 | Li | H01L 27/14625 |
| 2019/0139998 | A1* | 5/2019 | Cheng | H01L 27/14689 |
| 2019/0148437 | A1* | 5/2019 | Cheng | G02B 5/201 257/432 |
| 2020/0135793 | A1* | 4/2020 | Torii | H01L 27/14605 |
| 2020/0243590 | A1* | 7/2020 | Yamagishi | H01L 27/14636 |
| 2020/0343280 | A1* | 10/2020 | Ishino | H01L 27/14603 |

FOREIGN PATENT DOCUMENTS

| | | |
|---|---|---|
| KR | 101683300 B1 | 12/2016 |
| KR | 20170123806 A | 11/2017 |
| KR | 20180074159 A | 7/2018 |
| TW | 201411823 A | 3/2014 |
| TW | 201445681 A | 12/2014 |
| TW | 201901938 A | 12/2014 |

\* cited by examiner

BSI CHIP WITH BACKSIDE ALIGNMENT MARK

PRIORITY CLAIM AND CROSS-REFERENCE

This application is a continuation of U.S. patent application Ser. No. 16/865,819, entitled "BSI Chip with Backside Alignment Mark," and filed May 4, 2020, which claims the benefit of the U.S. Provisional Application No. 62/881,000, filed Jul. 31, 2019, and entitled "CIS BSI Chip with Backside Alignment Mark," which applications are hereby incorporated herein by reference.

BACKGROUND

Semiconductor image sensors are operated to sense light. Typically, the semiconductor image sensors include Complementary Metal-Oxide-Semiconductor (CMOS) Image Sensors (CIS) and Charge-Coupled Device (CCD) sensors, which are widely used in various applications such as Digital Still Camera (DSC), mobile phone camera, Digital Video (DV) and Digital Video Recorder (DVR) applications. These semiconductor image sensors utilize an array of image sensor elements, with each image sensor element including a photodiode and other elements, to absorb light and convert the sensed light into digital data or electrical signals.

Front Side Illumination (FSI) CMOS image sensors and Backside Illumination (BSI) CMOS image sensors are two types of CMOS image sensors. The FSI CMOS image sensors are operable to detect light projected from their front side, while the BSI CMOS image sensors are operable to detect light projected from their backside. When light projected into the FSI CMOS image sensors or the BSI CMOS image sensors, photoelectrons are generated and then are sensed by light-sensing devices in the pixels of the image sensors. The more the photoelectrons are generated, the better Quantum Efficiency (QE) the image sensors has, thus improving the image quality of the CMOS image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
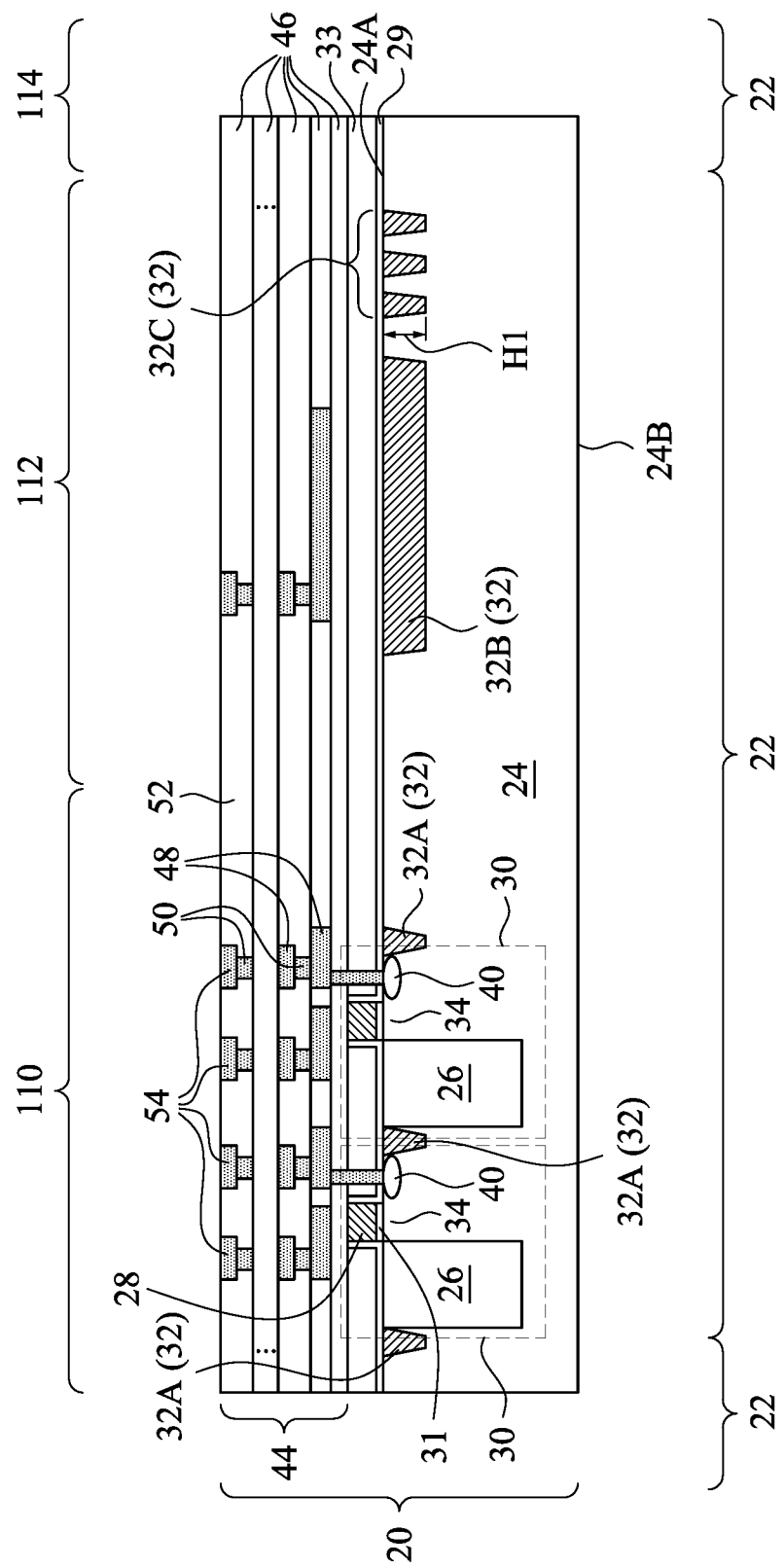
FIGS. 1-16 illustrate the cross-sectional views of intermediate stages in the formation of an image sensor chip in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Backside Illumination (BSI) image sensor chip and the method of forming the same are provided in accordance with some embodiments of the present disclosure. The intermediate stages in the formation of the BSI image sensor chip are illustrated in accordance with some embodiments of the present disclosure. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order. In accordance with some embodiments of the present disclosure, a backside alignment mark is formed on the backside of the BSI image sensor chip, and the backside alignment mark is formed by aligning to a front-side alignment mark. The backside alignment mark is formed at a time while it is still possible to view the front-side alignment mark from the backside. In the backside processes for forming the BSI image sensor chip, the backside alignment mark may be used for alignment.

Figure 21:
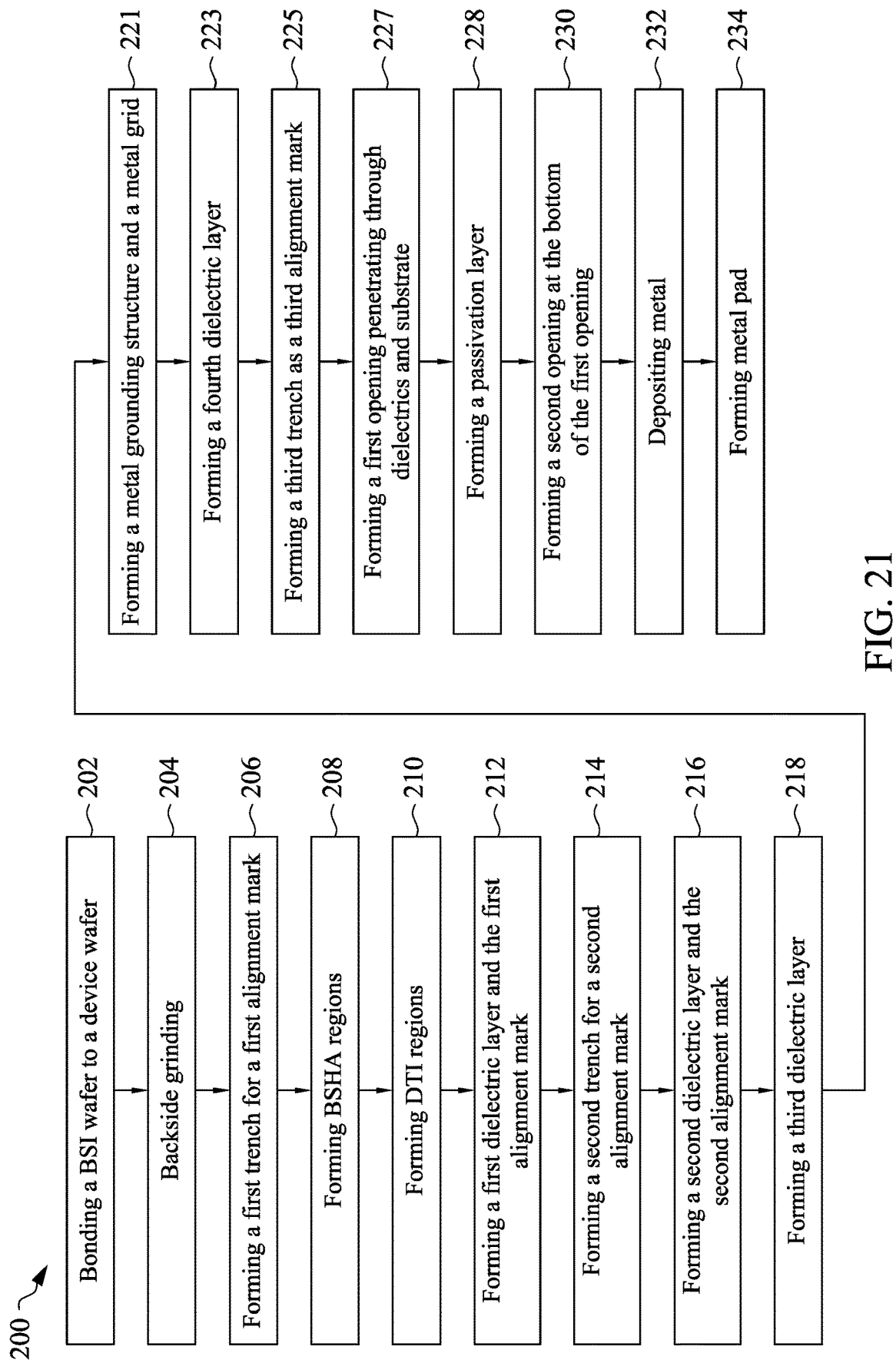
FIG. 21 illustrates a process flow for forming an image sensor chip in accordance with some embodiments.

FIGS. 1 through 16 illustrate the cross-sectional views of intermediate stages in the formation of a backside alignment mark(s) in accordance with some embodiments of the present disclosure. The corresponding processes are also reflected schematically in the process flow 200 shown in FIG. 21.

FIG. 1 illustrates the formation of an initial structure of image sensor chip 22, which may be a part of wafer 20 that includes a plurality of image sensor chips 22 therein. Image sensor chip 22 includes semiconductor substrate 24. In accordance with some embodiments of the present disclosure, semiconductor substrate 24 is a crystalline silicon substrate. In accordance with other embodiments of the present disclosure, semiconductor substrate 24 includes an elementary semiconductor such as germanium; a compound semiconductor including silicon carbon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates such as multi-layered or gradient substrates may also be used. Throughout the description, major surface 24A of substrate 24 is referred to as a front surface of semiconductor substrate 24, and major surface 24B is referred to as a back surface of semiconductor substrate 24. Surfaces 24A and 24B may be on (100) or (001) surface planes.

Figure 18:
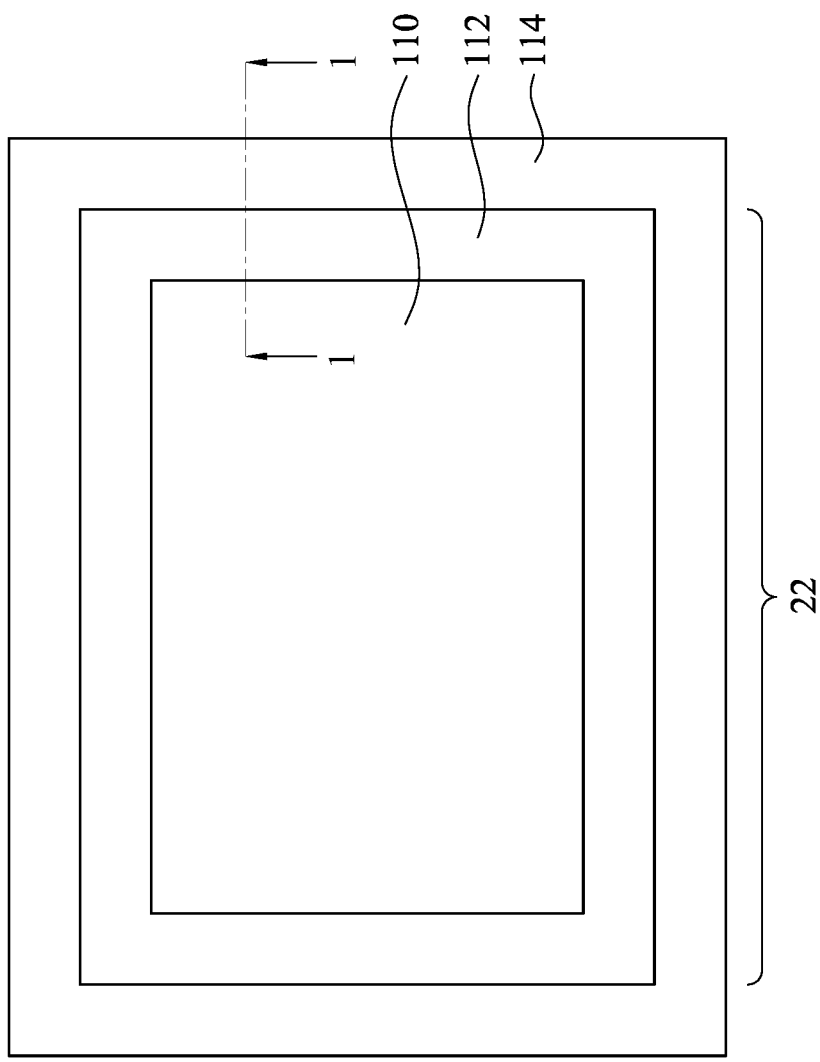
FIG. 18 illustrates a plane view of the zoning of an image sensor chip in accordance with some embodiments.
Figure 19:
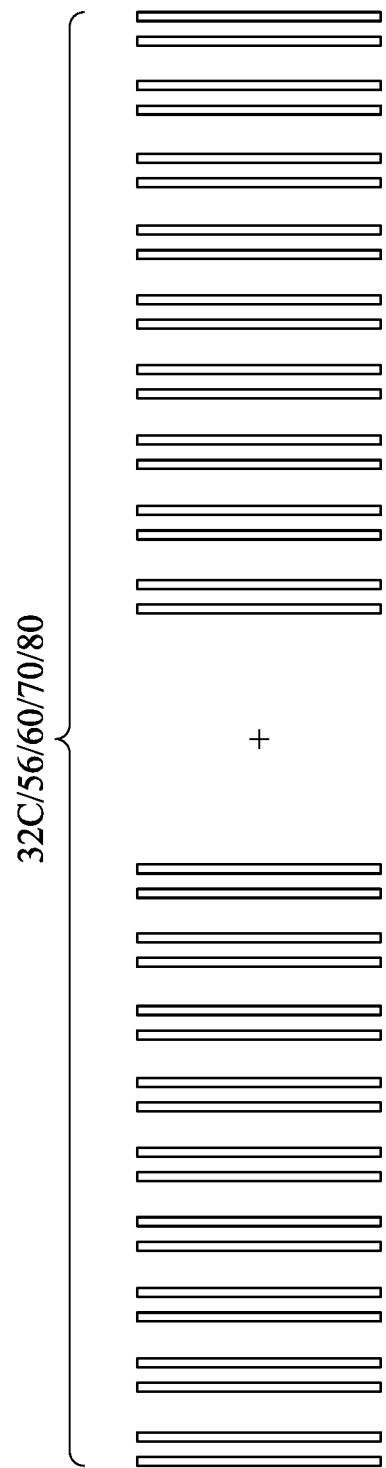
FIG. 19 illustrates an example alignment mark in accordance with some embodiments.

Isolation regions 32, which are alternatively referred to as Shallow Trench Isolation (STI) regions 32, are formed to extend into semiconductor substrate 24 to define regions (such as active regions). In accordance with some embodiments of the present disclosure, STI regions 32 include a plurality of parts having different functions. For example, STI regions 32 includes STI grid 32A, landing pad 32B for forming a metal pad, and front-side alignment mark 32C. STI grid 32A is a grid for forming an image sensor array therein. Landing pad 32B may be a pad that is large enough to accommodate a metal pad, as will be discussed in subsequent paragraphs. Front-side alignment mark 32C may include patterned STI regions having a unique pattern, thus acting as an alignment mark. The alignment mark 32C may be used for alignment purpose in the formation of front-side structures. In accordance with some embodiments of the present disclosure, the height H1 of alignment mark 32C may be in the range between about 1,000 Å and about 2,000 Å. In accordance with some embodiments of the present disclosure, alignment mark 32C is formed in metal pad region 112 (FIG. 18). In accordance with other embodiments, alignment mark 32C is formed in any other region including scribe line region 114, pixel region 110 (when spaces are available) in which image sensors are located, or the like. FIG. 19 illustrates an example plane view of an alignment mark, which has the pattern that may be adopted by alignment mark 32C in accordance with some embodiments of the present disclosure. For example, the strips and a cross may be STI regions or the spaces between the STI regions. Alignment mark 32C may also adopt any other usable patterns.

Referring back to FIG. 1, image sensors 26 are formed to extend from front surface 24A into semiconductor substrate 24. The formation of image sensors 26 may include implantation processes. Image sensors 26 are configured to convert light signals (photons) to electrical signals. Image sensors 26 may be photo-sensitive Metal-Oxide-Semiconductor (MOS) transistors, photo-sensitive diodes, or the like. Throughout the description, Image sensors 26 are alternatively referred to as photo diodes 26, although they may be other types of image sensors. In accordance with some embodiments of the present disclosure, photo diodes 26 form an image sensor array. Each of photo diodes 26 may be in a grid unit of the grid formed by STI regions 32A.

Figure 17:
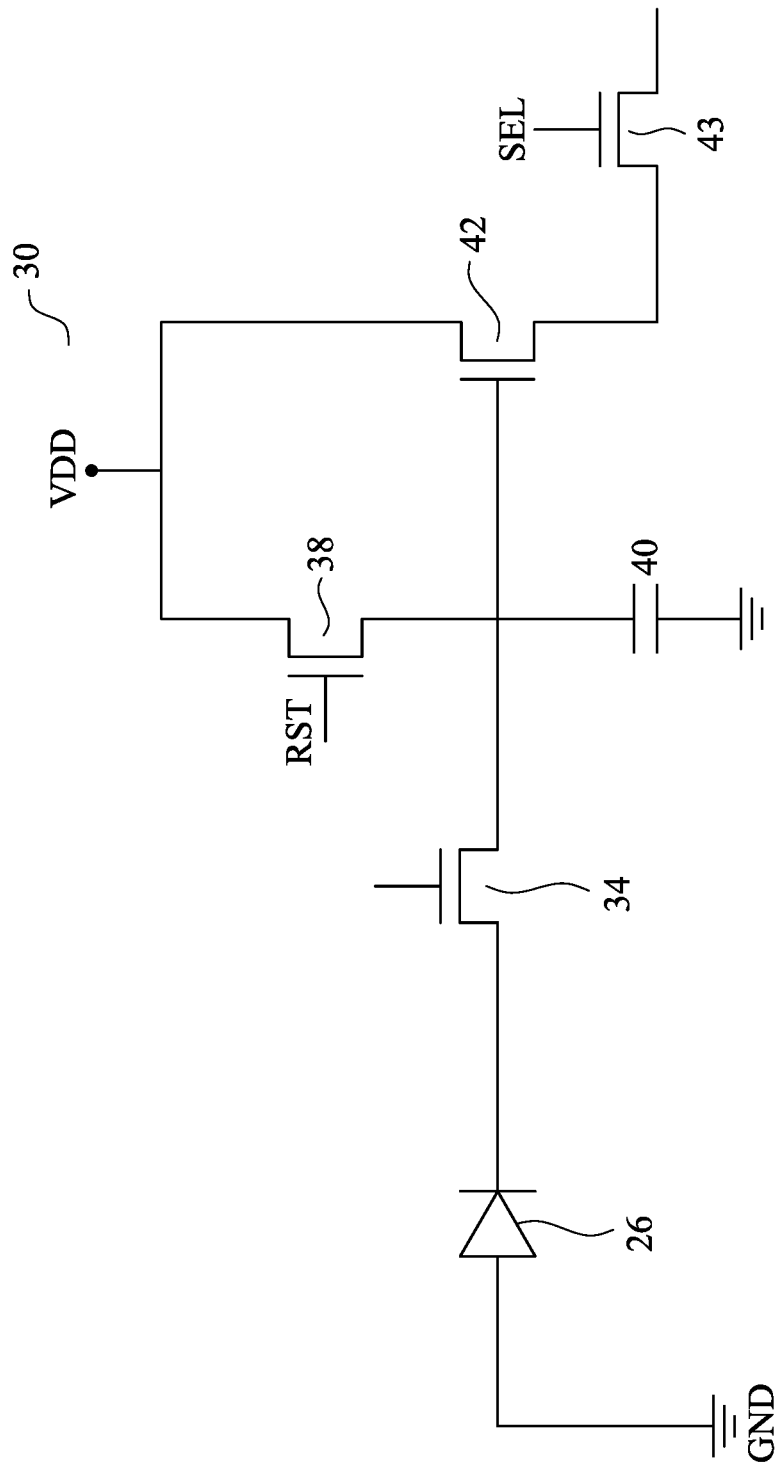
FIG. 17 illustrates the circuit diagram of a pixel of an image sensor in accordance with some embodiments.

FIG. 1 also illustrates pixel units 30, which have at least some parts in the active regions defined by STI grid 32A. FIG. 17 illustrates a circuit diagram of an example of pixel unit 30. In accordance with some embodiments of the present disclosure, pixel unit 30 includes photo diode 26, which has an anode coupled to the electrical ground GND, and a cathode coupled to a source of transfer gate transistor 34. The drain of transfer gate transistor 34 may be coupled to a drain of reset transistor 38 and a gate of source follower 42. Reset transistor 38 has a gate coupled to a reset line RST. A source of reset transistor 38 may be coupled to pixel power supply voltage VDD. Floating diffusion capacitor 40 may be coupled between the source/drain of transfer gate transistor 34 and the gate of source follower 42. Reset transistor 38 is used to preset the voltage at floating diffusion capacitor 40 to VDD. A drain of source follower 42 is coupled to a power supply voltage VDD. A source of source follower 42 is coupled to row selector 43. Source follower 42 provides a high-impedance output for pixel unit 30. The row selector 43 functions as the select transistor of the respective pixel unit 30, and the gate of the row selector 43 is coupled to select line SEL.

Referring back to FIG. 1, a transistor is illustrated as an example of the devices (such as transistors 34, 38, 42, and 43 in FIG. 17) in pixel unit 30. For example, transfer gate transistor 34 is illustrated in FIG. 1 as an example. In accordance with some embodiments of the present disclosure, each of photo diodes 26 is electrically coupled to a first source/drain region of transfer gate transistor 34, which includes gate 28 and gate dielectric 31. Gate dielectric 31 is in contact with front surface 24A of substrate 24. The first source/drain region of transfer gate transistor 34 may be shared by the corresponding connecting photo diode 26. Floating diffusion capacitor 40 is formed in substrate 24, for example, by implanting substrate 24 with a p-type impurity and an n-type impurity to different depths to form a p-n junction, which acts as floating diffusion capacitor 40. Floating diffusion capacitor 40 may be formed in a second source/drain region of transfer gate transistor 34, and hence one of the capacitor plates of floating diffusion capacitor 40 is electrically coupled to the second source/drain region of transfer gate transistor 34. Photo diodes 26, the respective transfer gate transistors 34, and floating diffusion capacitors 40 in the same active region form pixel units 30 as also marked in FIG. 1.

FIG. 18 illustrates a schematic zoning scheme of BSI chip 22 in accordance with some embodiments of the present disclosure, and FIG. 1 shows the cross-section view obtained from the reference cross-section 1-1 as in FIG. 18. BSI chip 22 may include pixel region 110, in which pixel units 30 (FIG. 1) are formed, which pixel units are also formed as an array. Scribe line regions 114 are formed as a grid throughout the respective wafer to separate BSI image sensor chips 22 from each other. Metal pad region 112 (which is also a peripheral region) is formed between scribe line region 114 and pixel region 110. In accordance with some embodiments of the present disclosure, peripheral region 112 may be formed as a ring encircling pixel region 110, as illustrated in FIG. 18. In accordance with alternative embodiments, instead of forming a ring, peripheral region 112 extends to one side, two sides, or three sides, of pixel region 110, but not the remaining side(s).

Referring again back to FIG. 1, a Contact Etch Stop Layer 29 is formed on substrate 24 and transistors such as transfer gate transistors 34. CESL 29 may be formed of silicon oxide, silicon nitride, silicon carbo-nitride, or the like, or the multi-layers thereof. CESL 29 may be formed using a conformal deposition method such as Atomic Layer Deposition (ALD) or Chemical Vapor Deposition (CVD), for example. Inter-Layer Dielectric (ILD) 33 is formed over CESL 29. ILD 33 may include a dielectric material formed using, for example, Flowable Chemical Vapor Deposition (FCVD), spin-on coating, CVD, or another deposition method. ILD 33 may also be formed of an oxygen-containing dielectric material, which may be an oxide such as silicon oxide, Phospho-Silicate Glass (PSG), Boro-Silicate Glass (BSG), Boron-Doped Phospho-Silicate Glass (BPSG), or the like.

Front-side interconnect structure 44 is formed over semiconductor substrate 24. Front-side interconnect structure 44 is used to electrically interconnect the devices in image sensor chip 22, and connect to other package components. Front-side interconnect structure 44 includes dielectric layers 46, and metal lines 48 and vias 50 in dielectric layers 46. Throughout the description, the metal lines 48 in a same dielectric layer 46 are collectively referred to as being a metal layer. Front-side interconnect structure 44 may include a plurality of metal layers. In accordance with some embodiments of the present disclosure, dielectric layers 46 include low-k dielectric layers. The low-k dielectric layers have low k values, for example, lower than 3.8, and possibly lower than about 3.0.

Surface dielectric layer 52 is formed as a top dielectric layer of wafer 20. Surface dielectric layer 52 may be formed of non-low-k dielectric materials having k values equal to or greater than about 3.8. In accordance with some embodiments of the present disclosure, surface dielectric layer 52 is formed of or comprises silicon oxide.

Bonding pads 54 are further formed at the top of wafer 20. Bonding pads 54 may be formed of or comprise copper. Bonding pads 54 may also include barrier layers encircling the copper. The top surfaces of bonding pads 54 may be coplanar with the top surface of surface dielectric layer 52.

Figure 2:
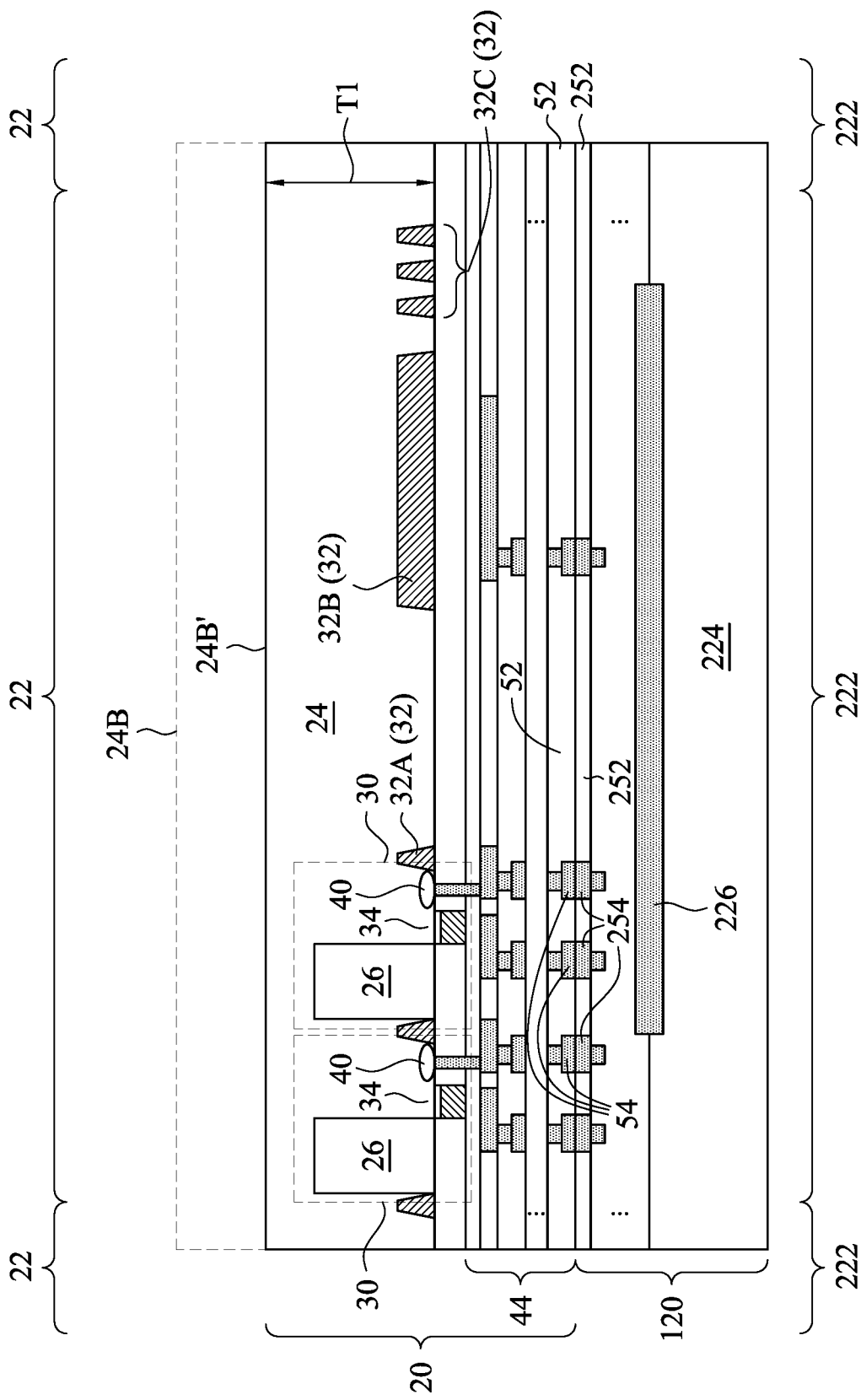

Next, referring to FIG. 2, wafer 20 is bonded to wafer 120. The respective process is illustrated as process 202 in the process flow shown in FIG. 21. In accordance with some embodiments of the present disclosure, the bonding is performed through hybrid bonding. Accordingly, surface dielectric layer 52 in wafer 20 is bonded to surface dielectric layer 252 in wafer 120 through fusion bonding, for example, with S—O—Si bonds formed. Bond pads 54 of wafer 20 are also bonded to the metal pads 254 in wafer 120 through metal-to-metal direct bonding.

In accordance with some embodiments of the present disclosure, wafer 120 includes chips 222, which further includes logic circuits 226 therein. The logic circuits 226 may include the application circuit used for the processing and the using of the electrical signal obtained from BSI chip 22. For example, the logic circuits 226 may include one or more of Image Signal Processing (ISP) circuits that are used for processing the image-related signals obtained from image sensor chip 22. The Image Signal Processing (ISP) circuits may include Analog-to-Digital Converters (ADCs), Correlated Double Sampling (CDS) circuits, row decoders, and the like. Through bond pads 54 and 254, the circuits in wafer 120 are electrically and signally connected to the image sensor circuits in wafer 20.

Further referring to FIG. 2, a backside grinding process is performed to grind back surface 24B to thin semiconductor substrate 24. The respective process is illustrated as process 204 in the process flow shown in FIG. 21. The resulting back surface is referred to as 24B' in FIG. 2. The thickness of substrate 24 may be reduced to smaller than about 20 μm or smaller than about 15 μm, so that light can penetrate from back surface 24B' into semiconductor substrate 24 and reach photo diodes 26. To improve the light-receiving efficiency, the thickness T1 of substrate 24 is kept to have a relatively large value, for example, greater than about 6 μm.

Figure 3:
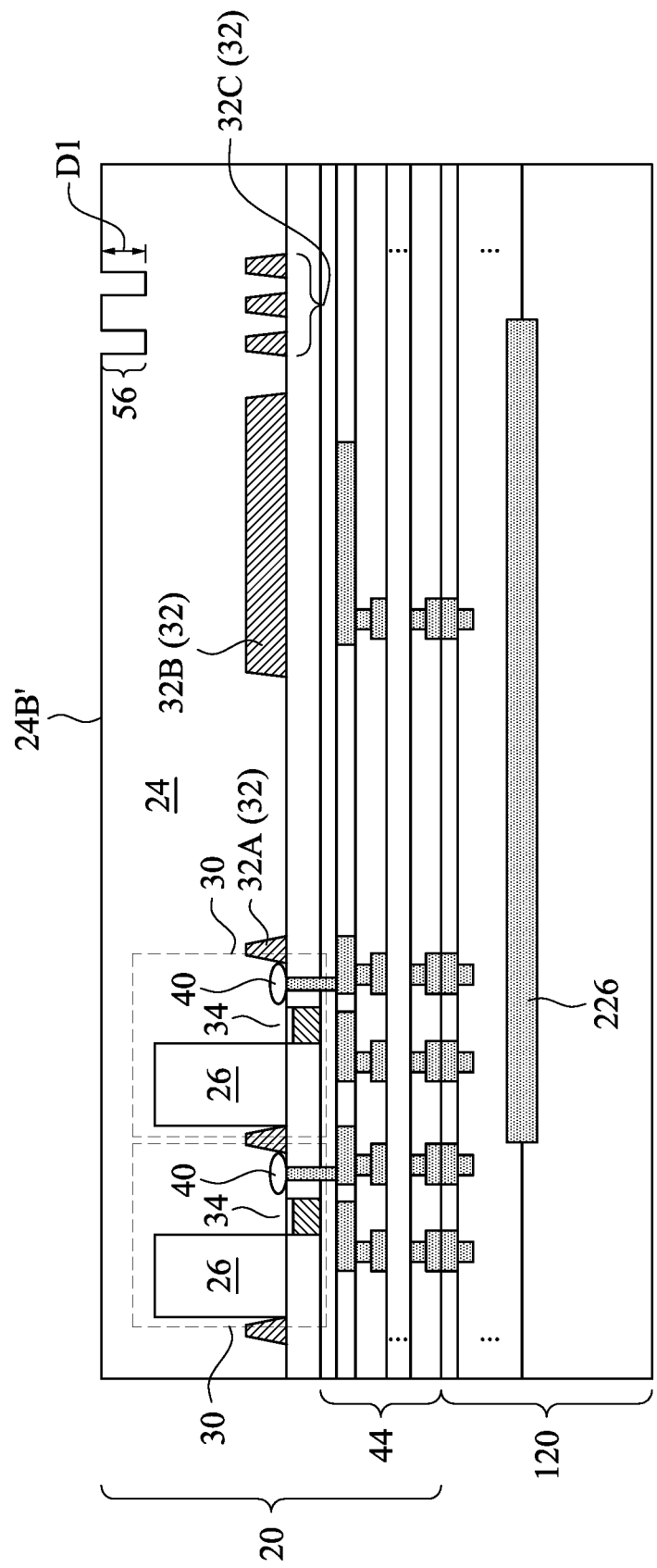

FIG. 3 illustrates the formation of alignment mark 56, which includes one or a plurality of trenches extending from the back surface 24B' into semiconductor substrate 24. The respective process is illustrated as process 206 in the process flow shown in FIG. 21. The trenches may be formed through a dry etching process, which may be performed using process gases such as $C_2F_6$, $CF_4$, $SO_2$, the mixture of HBr, $Cl_2$, and $O_2$, the mixture of HBr, $Cl_2$, and $O_2$, or the mixture of HBr, $Cl_2$, $O_2$, and $CF_2$ etc. The pattern of alignment mark 56 may adopt any distinguishable pattern, which may include the pattern shown in FIG. 19. The depth D1 of alignment mark 56 may be in the range between about 1,800 Å and about 2,000 Å. The position of alignment mark 56 is determined using alignment mark 32C as the alignment mark. Alternatively stated, alignment mark 56 is formed using alignment mark 32C for alignment.

In accordance with some embodiments of the present disclosure, alignment mark 56 is formed in metal pad region 112 (FIG. 18). In accordance with other embodiments, alignment mark 56 is formed in any other region including scribe line region 114, pixel region 110 (when spaces are available), or the like. Alignment mark 56 may be vertically aligned to alignment mark 32C, or may be horizontally offset from alignment mark 32C.

Figure 4:
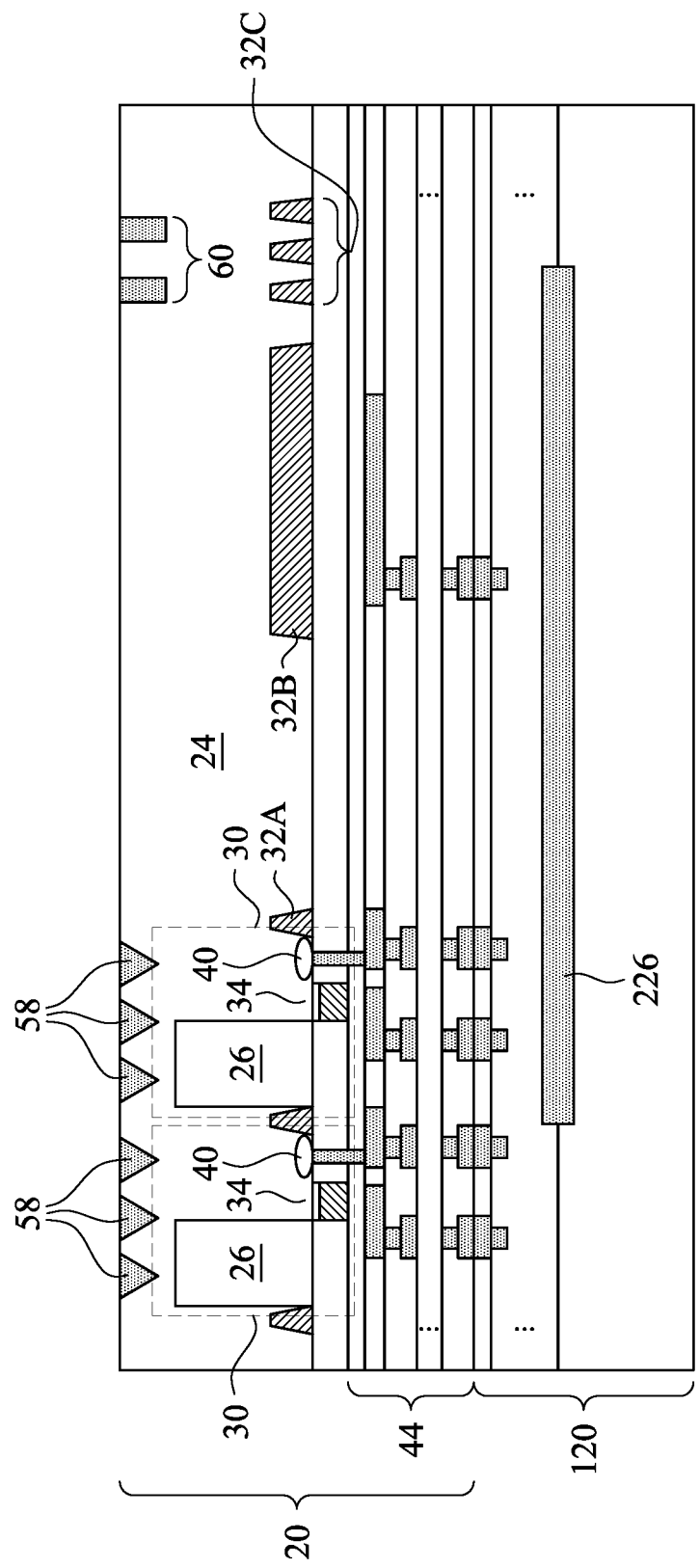

FIG. 4 illustrates the formation of Backside High-Absorption (BSHA) regions 58. BSHA regions 58 have the function of focusing light to improve the absorption of light. The respective process is illustrated as process 208 in the process flow shown in FIG. 21. In accordance with some embodiments of the present disclosure, there is a single one or a plurality of (such as two, three, four or more) BSHA regions 58 overlapping the same pixel unit 30. In accordance with some embodiments of the present disclosure, the formation of BSHA regions 58 includes forming an etching mask over semiconductor substrate 24. The etching mask has openings aligning to the pixel units, with each opening corresponding to one BSHA region 58 that is to be formed. The formation of the etching mask may be performed using either one of alignment mark 32C or alignment mark 56 for the alignment (the positioning). Semiconductor substrate 24 is then etched through the opening to form a plurality pyramid shaped openings, which may be achieved through a wet etching process, so that the etching along the lattice direction will result in the pyramid shaped openings. Next, a transparent material, which may be silicon oxide or like transparent material is deposited, and is filled into the openings. A planarization process such as a Chemical Mechanical Polish (CMP) process or a mechanical polish process is then performed, resulting in BSHA regions 58.

Figure 8:
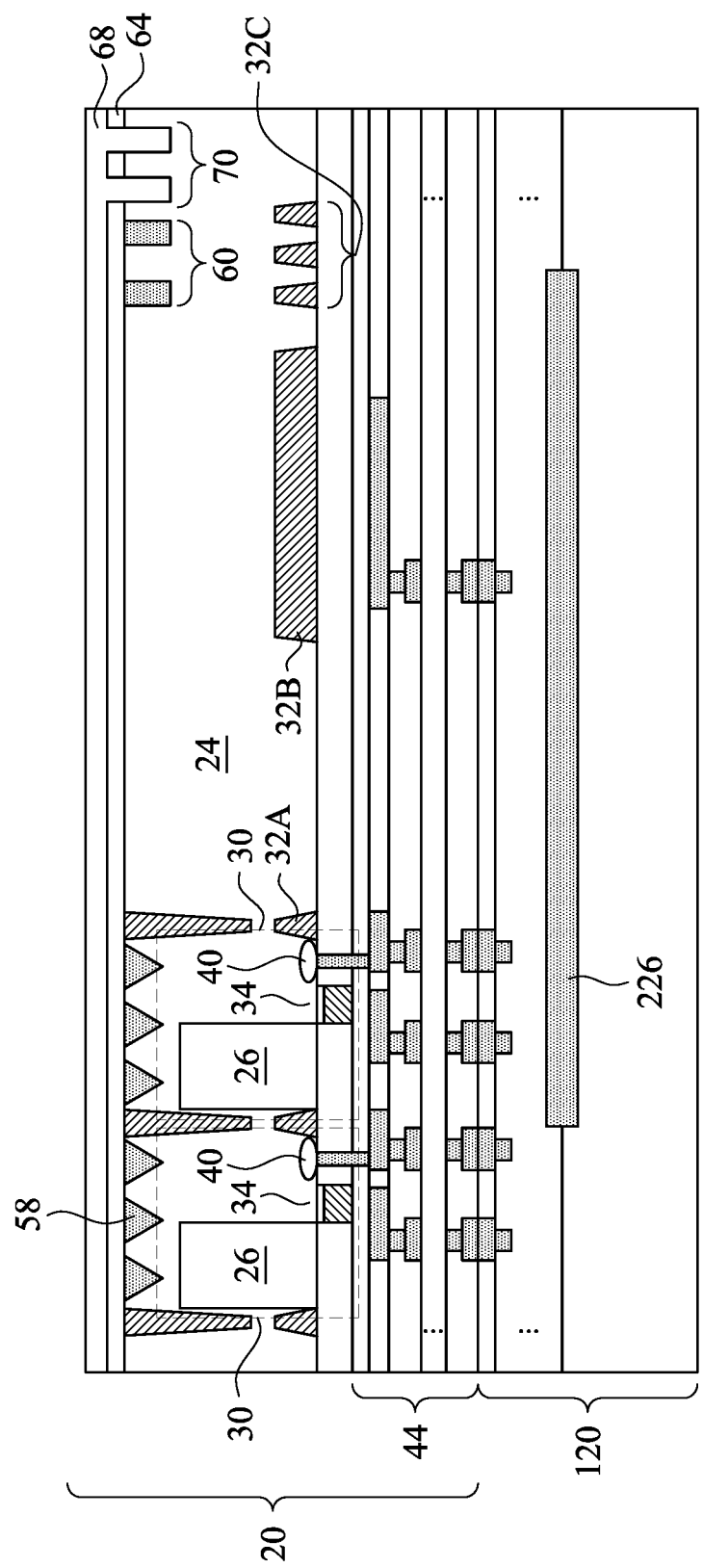

In accordance with some embodiments of the present disclosure, at the same time BSHA regions 58 are formed, alignment mark 56 is also filled by the same material for forming BSHA regions 58, thus forming alignment mark 60. In accordance with alternative embodiments, instead of filling openings 56 at the same time BSHA regions 58 are formed, openings 56 may be masked during the filling process, and filled in later processes with other materials. For example, openings 56 may be filled in the processes shown in FIG. 6 and/or FIG. 8, and the resulting alignment mark 60 will be formed of the same material as that of dielectric layers 64 (FIG. 6) and/or 68 (FIG. 8).

Figure 5:
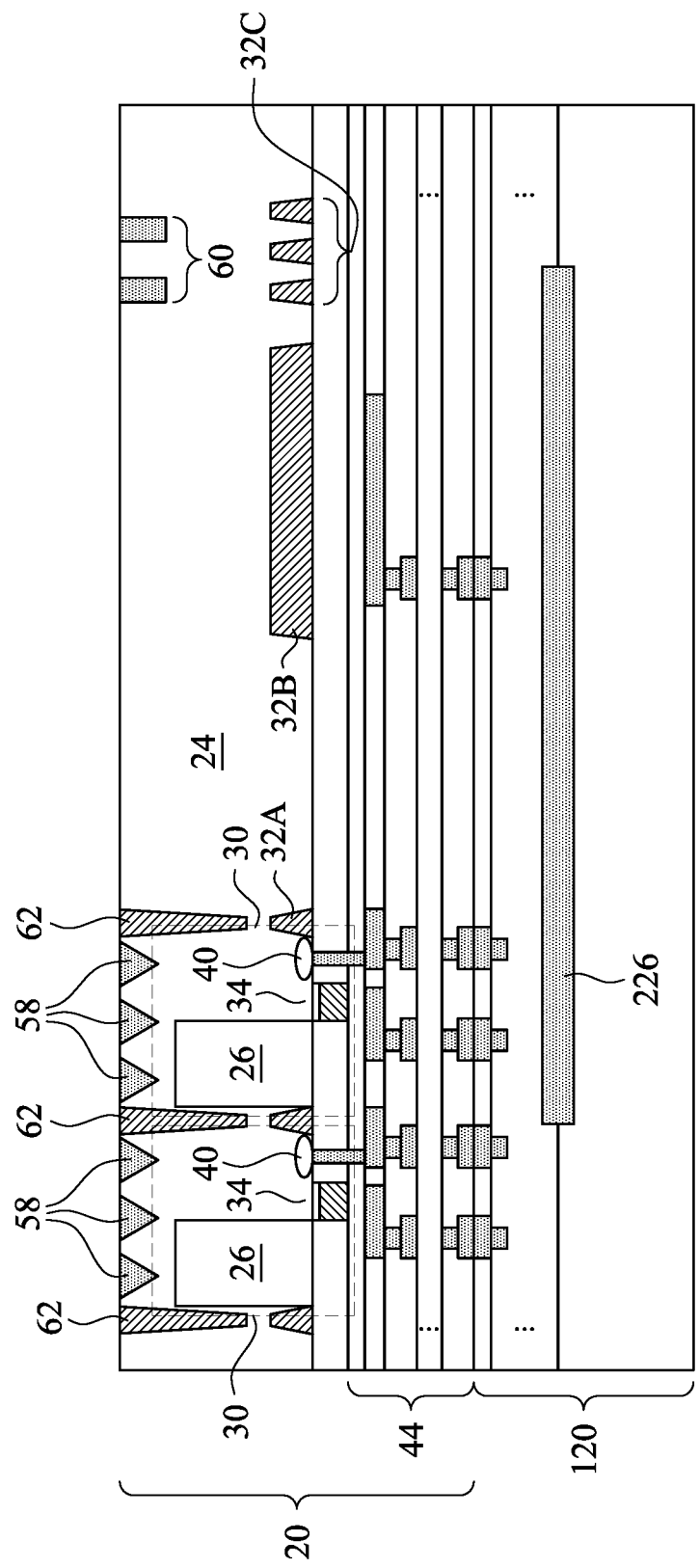

Referring to FIG. 5, Deep Trench Isolation (DTI) regions 62 are formed. The respective process is illustrated as process 210 in the process flow shown in FIG. 21. In accordance with some embodiments of the present disclosure, the formation of DTI regions 62 include etching semiconductor substrate 24, and filling the resulting trenches with a high-k dielectric material such as $Ta_2O_5$, an opaque material such as a metal (tungsten, for example), or combinations thereof. DTI regions 62 have the function of preventing light to penetrate through, and have the function of preventing the cross-talk of light signals. In accordance with some embodiments of the present disclosure, DTI regions 62 form a grid, with the grid lines of DTI regions 62 vertically aligned to the grid lines of STI grid 32A.

Figure 6:
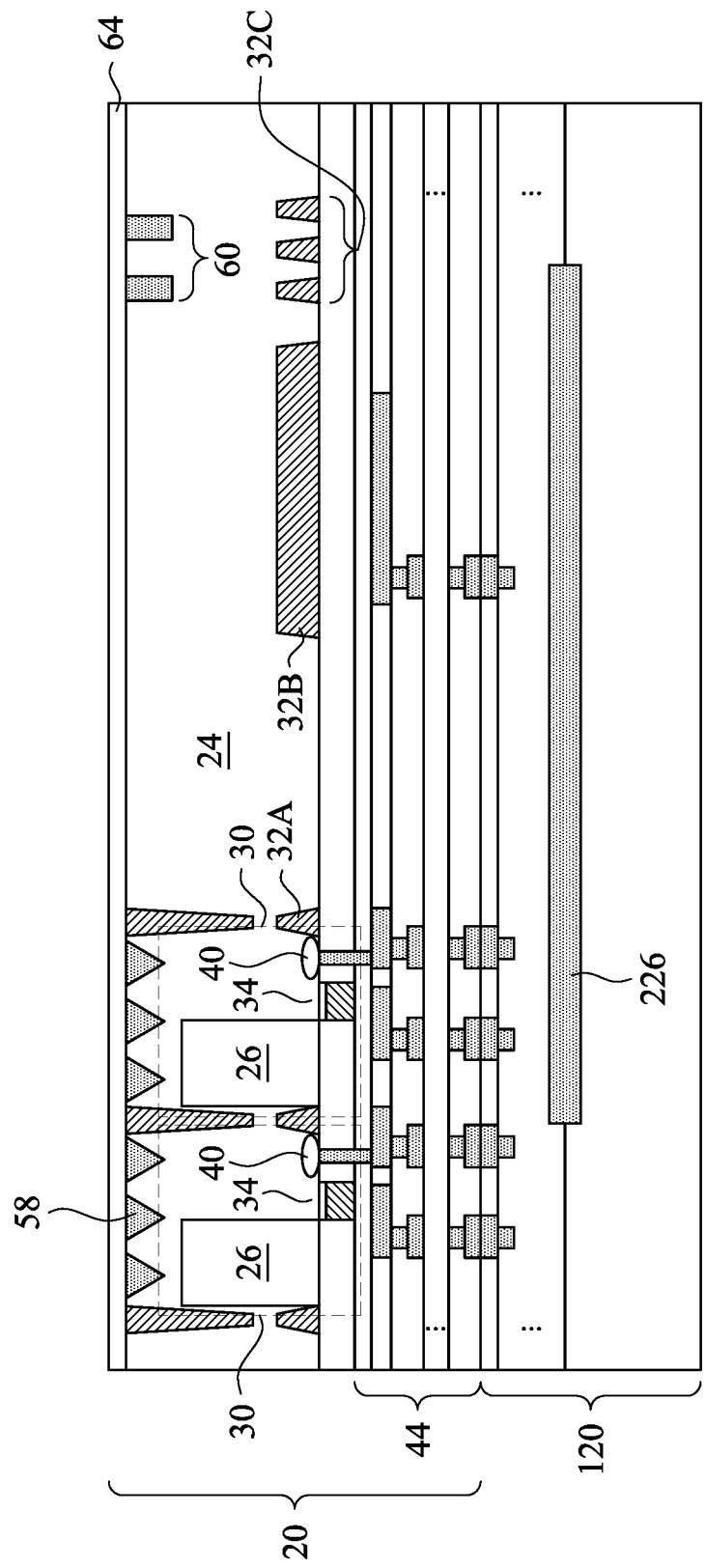

FIG. 6 illustrates the formation of dielectric layer 64. The respective process is illustrated as process 212 in the process flow shown in FIG. 21. In accordance with some embodiments of the present disclosure, dielectric layer 64 is a high-k dielectric layer, which may be made of or comprise aluminum oxide ($Al_2O_3$), hafnium oxide ($HfO_2$), tantalum oxide ($Ta_2O_5$) or the like. The thickness of dielectric layer 64 may be in the range between about 30 Å and about 80 Å. The deposition process may include Chemical Vapor Deposition (CVD), Plasma-Enhanced Chemical Vapor Deposition (PECVD), Atomic Layer Deposition (ALD), or the like.

Figure 7:
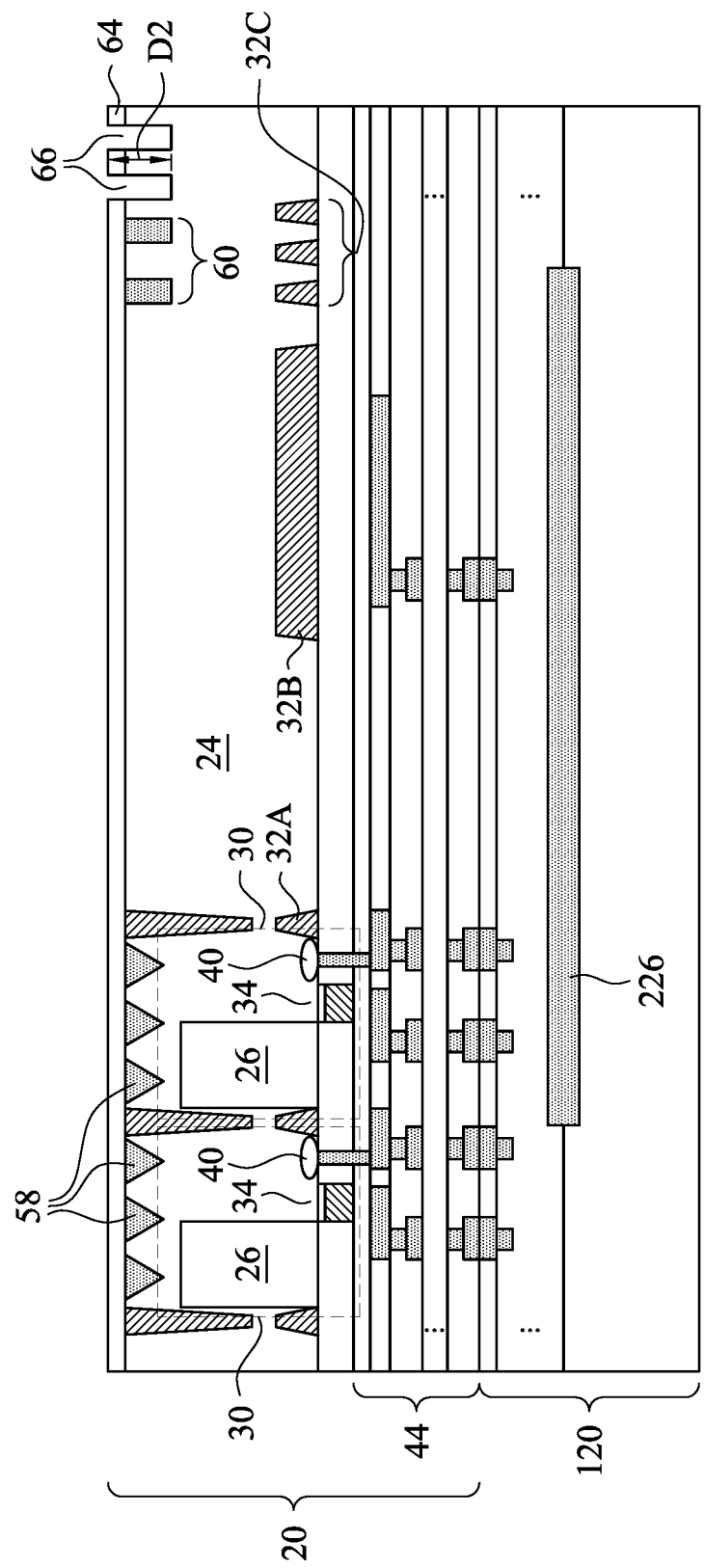

Next, as shown in FIG. 7, trenches 66 are formed. The respective process is illustrated as process 214 in the process flow shown in FIG. 21. The formation of trenches 66 may be performed using a dry etching process. Trenches 66 may adopt any distinguishable pattern, which may include the pattern shown in FIG. 19 as an example. The depth D2 of trenches 66 may be in the range between about 1,800 Å and about 2,000 Å. The position of trenches 66 is determined using either alignment mark 32C or alignment mark 60 as the alignment mark. Trenches 66 may be vertically aligned to alignment mark 32C, or may horizontally offset from alignment mark 32C.

FIG. 8 illustrates the formation of dielectric layer(s) 68 and the filling of trenches 66 to form alignment mark 70. The respective process is illustrated as process 216 in the process flow shown in FIG. 21. In accordance with some embodiments of the present disclosure, dielectric layer 68 is a single layer or a composite layer including a plurality of layers. For example, dielectric layer 68 may be or comprise a hafnium oxide layer, and may or may not include a tantalum oxide ($Ta_2O_5$) layer over the hafnium oxide layer. The thickness of the hafnium oxide layer may be in the range between about 30 Å and about 80 Å. The thickness of the tantalum oxide layer may be in the range between about 300 Å and about 800 Å. The deposition process may include CVD, PECVD, ALD, or the like. Depending on the widths of the trenches, trenches 66 may be fully filled at this time, or may be partially filled, and will be further filled by subsequently deposited layers such as dielectric layer 72 in FIG. 9.

Figure 9:
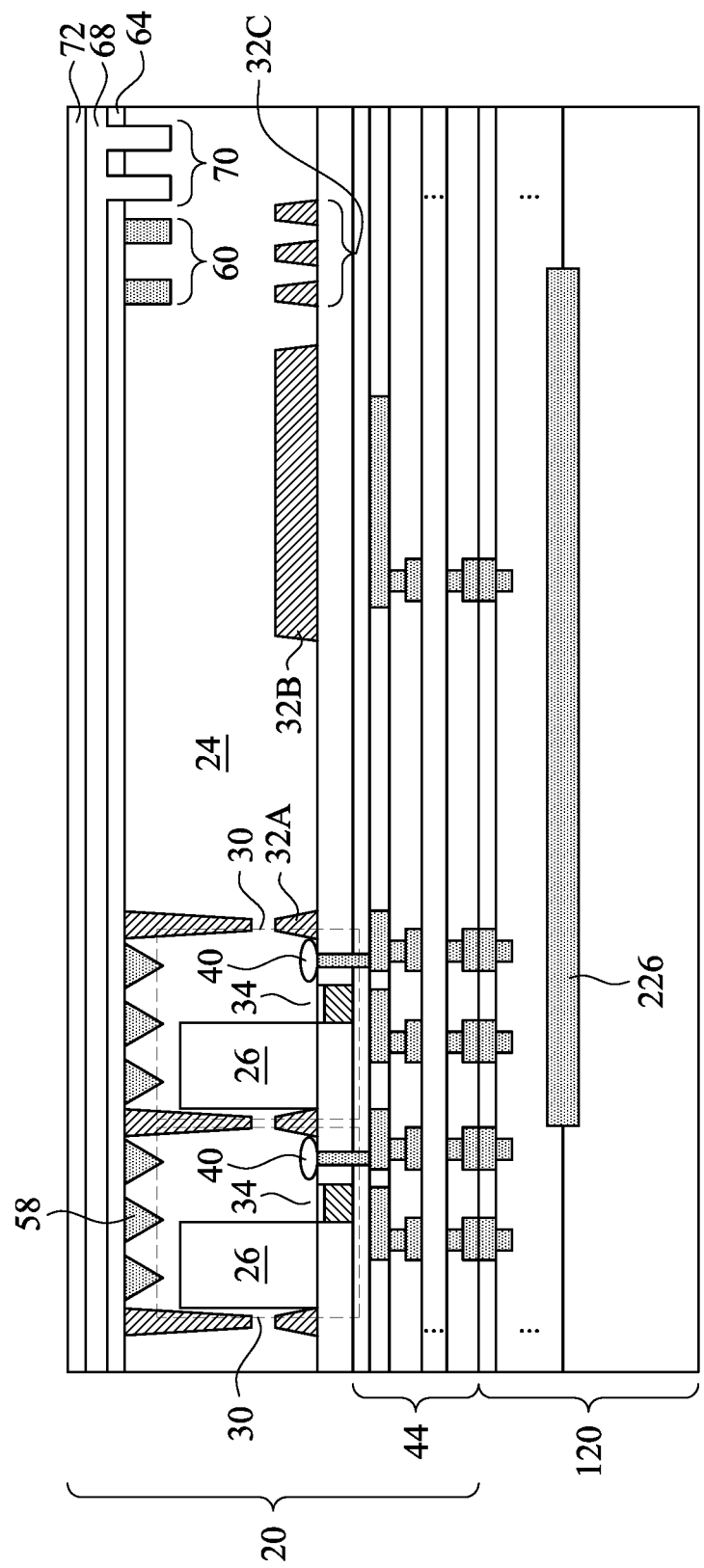

FIG. 9 illustrates the formation of dielectric layer 72. The respective process is illustrated as process 218 in the process flow shown in FIG. 21. In accordance with some embodiments of the present disclosure, dielectric layer 72 is formed of silicon oxide or the like transparent material. The thickness of dielectric layer 72 may be in the range between about 1,000 Å and about 2,000 Å. The deposition process may include CVD, PECVD, ALD, or the like.

Figure 10:
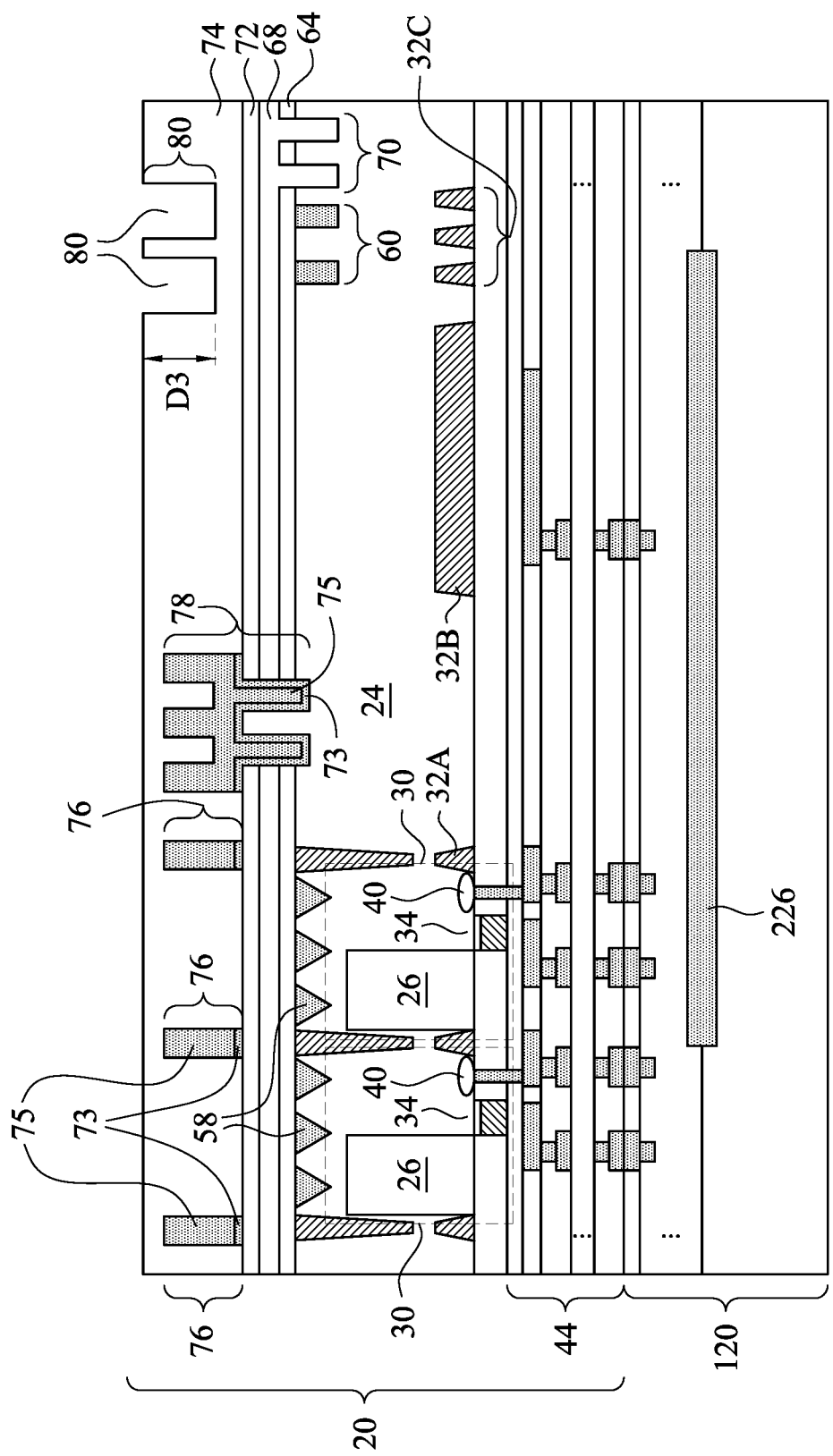

FIG. 10 illustrates the formation of metal grid 76, metal grounding structure 78, dielectric layer 74, and trenches 80 in accordance with some embodiments of the present disclosure. The formation process may include etching dielectric layers 72, 68, and 64 to form one or more opening, so that semiconductor substrate 24 is exposed. The opening(s) may also extend into semiconductor substrate 24. Next, metallic materials are deposited. In accordance with some embodiments of the present disclosure, the metallic materials include adhesion layer 73, and metallic material 75 on adhesion layer 73. Adhesion layer 73 may include a titanium layer, a titanium nitride layer, or a composite layer including a titanium layer and a titanium nitride layer over the titanium layer. Adhesion layer 73 may have a thickness in the range between about 400 Å and about 600 Å. The metallic material 75 may include tungsten, chromium, or the like, and may have a thickness in the range between about 1.5 kÅ and about 2.5 kÅ.

After the deposition, a patterning process is performed through etching, and the metallic material 75 and the adhesion layer 73 are patterned as metal grid 76 and grounding structure 78. The respective process is illustrated as process 221 in the process flow shown in FIG. 21. When viewed from the top of the metal grid 76, metal grid 76 includes a first plurality of strips extending in a first direction, and a second plurality of strips extending in a second direction perpendicular to the first direction, wherein the second plurality of strips are connected to the first plurality of strips. The grid openings in metal grid 76 further overlap the grid openings of DTI region 62 and STI grid 32A, so that light can pass through, and confined in, the openings to reach the underlying photo diodes 26. The grounding structure 78 extends into the openings in dielectric layers 72, 68, and 64 to physically and electrically contact semiconductor substrate 24.

After the formation of metal grid 76 and grounding structure 78, dielectric layer 74 is deposited. The respective process is illustrated as process 223 in the process flow shown in FIG. 21. In accordance with some embodiments of the present disclosure, dielectric layer 74 is formed of silicon oxide or the like transparent material. The thickness of dielectric layer 74 may be in the range between about 4,000 Å and about 6,000 Å. Dielectric layer 74 may be planarized in a CMP process or a mechanical polish process, so that its top surface is planar.

Next, as also shown in FIG. 10, trenches 80 are formed. The respective process is illustrated as process 225 in the process flow shown in FIG. 21. The formation may be performed using a dry etching process. Trenches 80 may adopt any distinguishable pattern, which may include the pattern shown in FIG. 19 as an example. The depth D3 of trenches 80 may be in the range between about 2,000 Å and about 3,000 Å. The depth D3 of trenches 80 is controlled so that dielectric layer 74 is not etched-through to cause the trenches 80 to undesirable reach the high-k dielectric layers since this may cause the high-k dielectric layers to be exposed and degraded. The position of trenches 80 is determined using either alignment mark 60 or alignment mark 70 as the alignment mark. Since semiconductor substrate 24 is thick, it may be difficult to adopt alignment mark 32C for aligning trenches 80. Trenches 80 may be vertically aligned to alignment mark 32C, or may horizontally offset from alignment mark 32C. Trenches 80 may be partially or fully filled in subsequent processes, and the corresponding filling is referred to as alignment mark 80 also.

Figure 11:
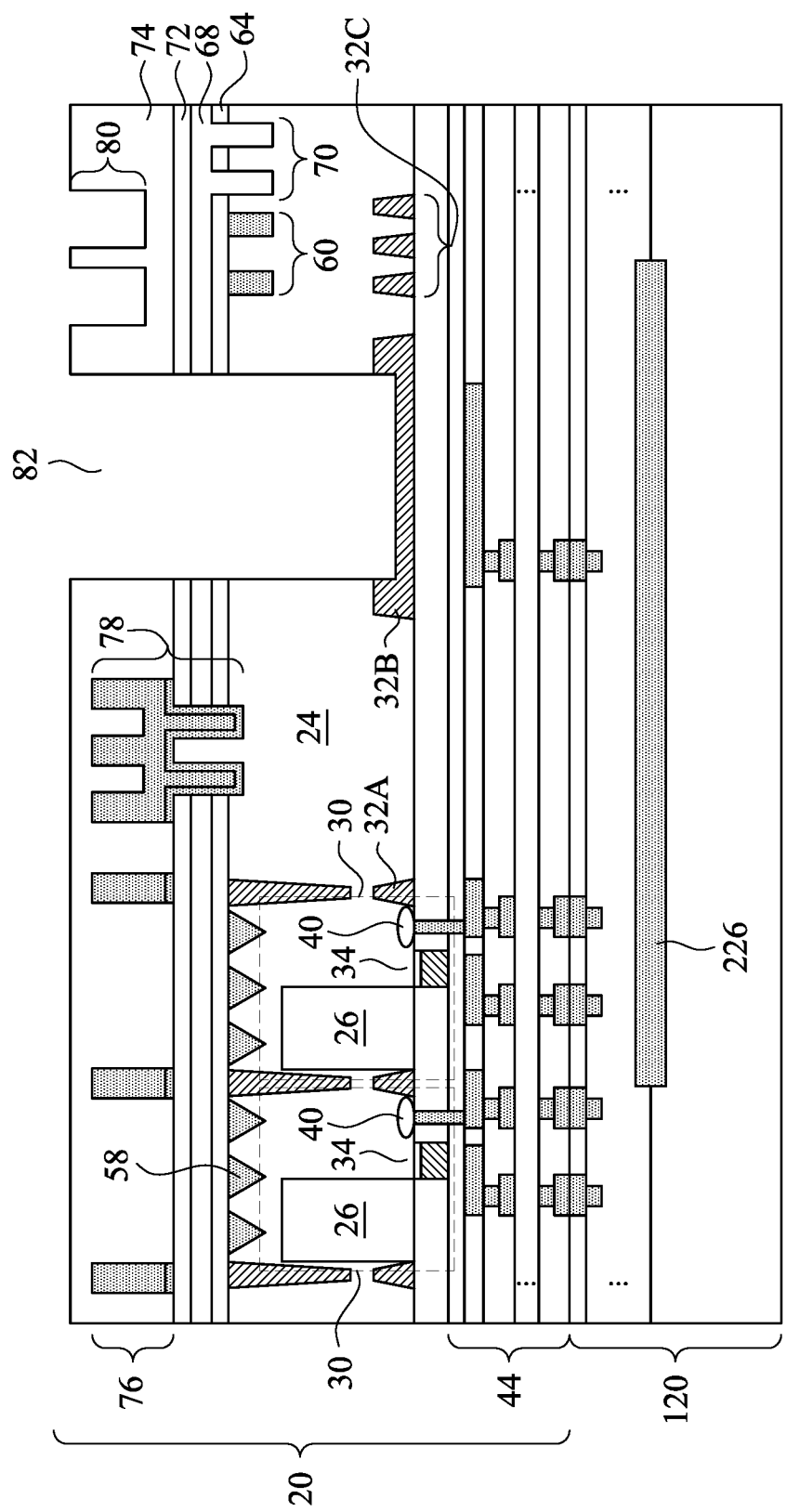

FIG. 11 illustrates the formation of opening 82, which is formed by etching dielectric layers formed on the backside of semiconductor substrate 24, and then etching-through semiconductor substrate 24. The respective process is illustrated as process 227 in the process flow shown in FIG. 21. The etching is stopped on STI pad 32B, while some over-etching may be resulted so that opening 82 partially extends into STI pad 32B. The etching is controlled so that STI pad 32B is not etched-through. The formation of opening 82 may be performed using alignment mark 80, alignment mark 70, or alignment mark 60 to determine its position.

Figure 12:
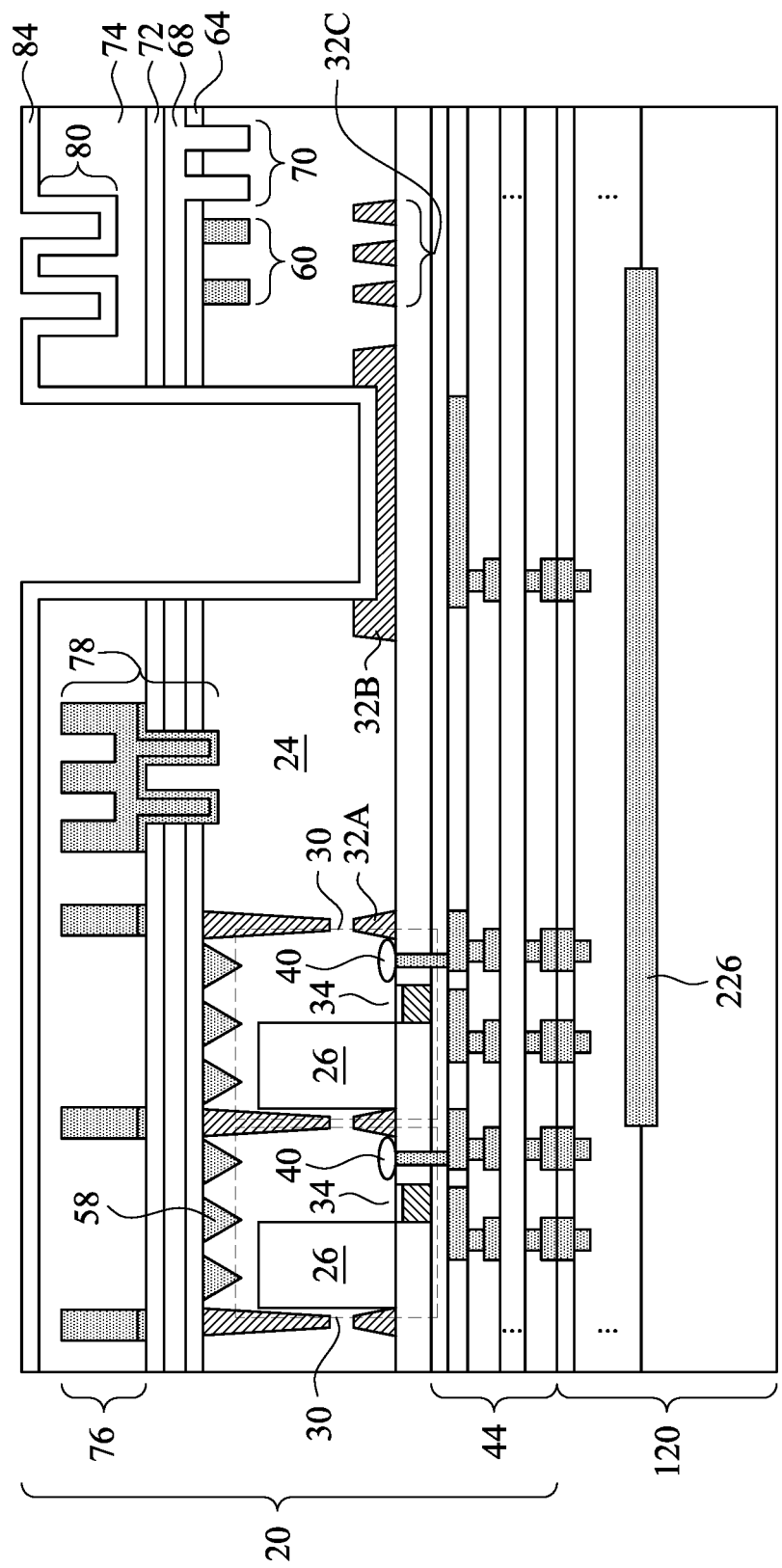

Next, as shown in FIG. 12, dielectric layer 84 is formed as a blanket layer, which includes some portions extending into opening 82, and other portions overlapping dielectric layer 74. The respective process is illustrated as process 228 in the process flow shown in FIG. 21. In accordance with some embodiments of the present disclosure, dielectric layer 84 is formed of silicon oxide, which may be formed through PECVD or other applicable methods. The thickness of dielectric layer 84 may be in the range between about 1,500

Å and about 2,500 Å. Dielectric layer 84 is sometimes referred to as a passivation layer.

Figure 13:
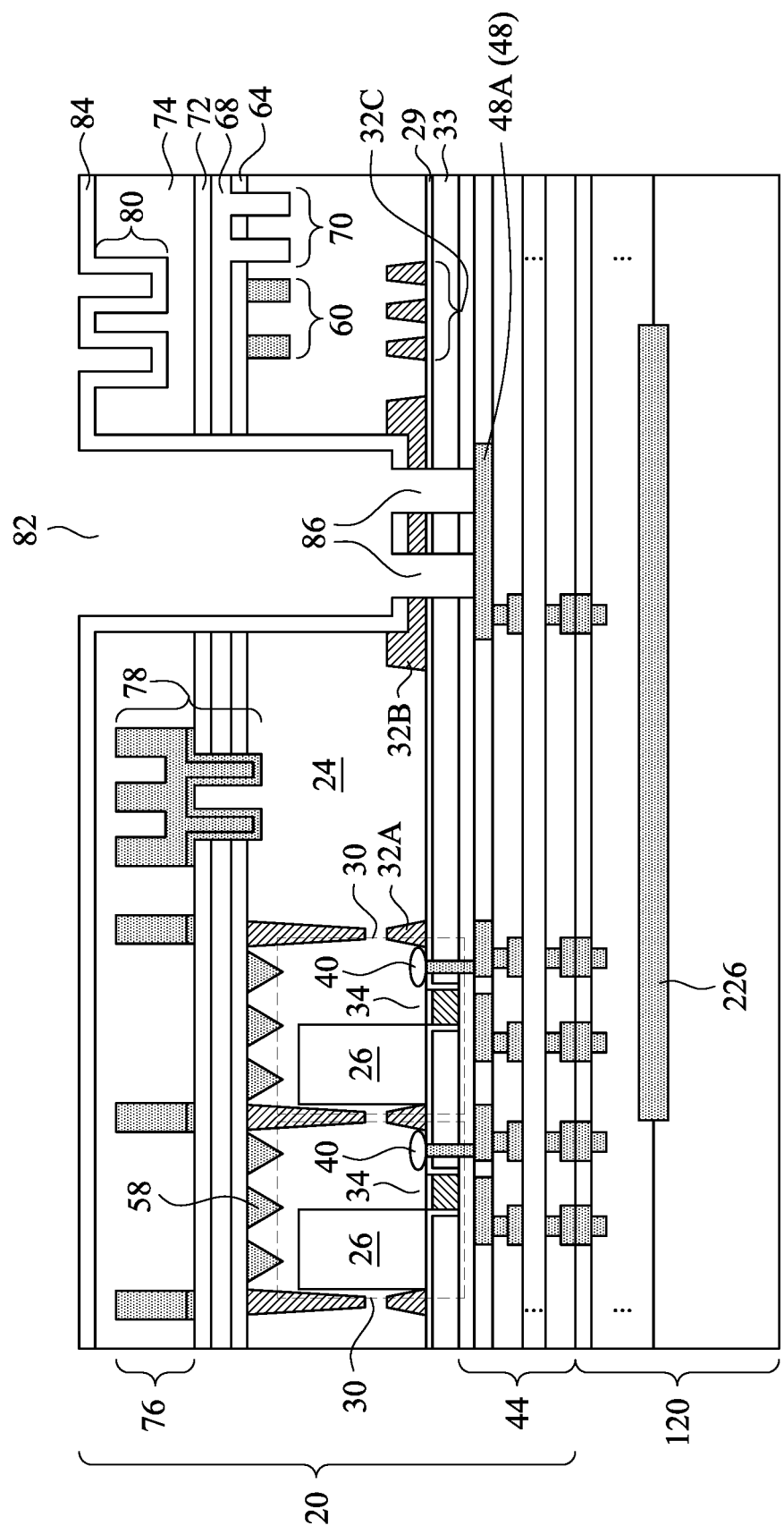

FIG. 13 illustrates the formation of opening(s) 86 at the bottom of opening 82 by etching ILD 33 and CESL 29, and possibly the dielectric layers 46 in the interconnect structure 44. The respective process is illustrated as process 230 in the process flow shown in FIG. 21. Accordingly, metal pad 48A in the interconnect structure 44 is exposed. The formation of openings 86 may be performed using alignment mark 80, alignment mark 70, or alignment mark 60 to determine its position.

Figure 14:
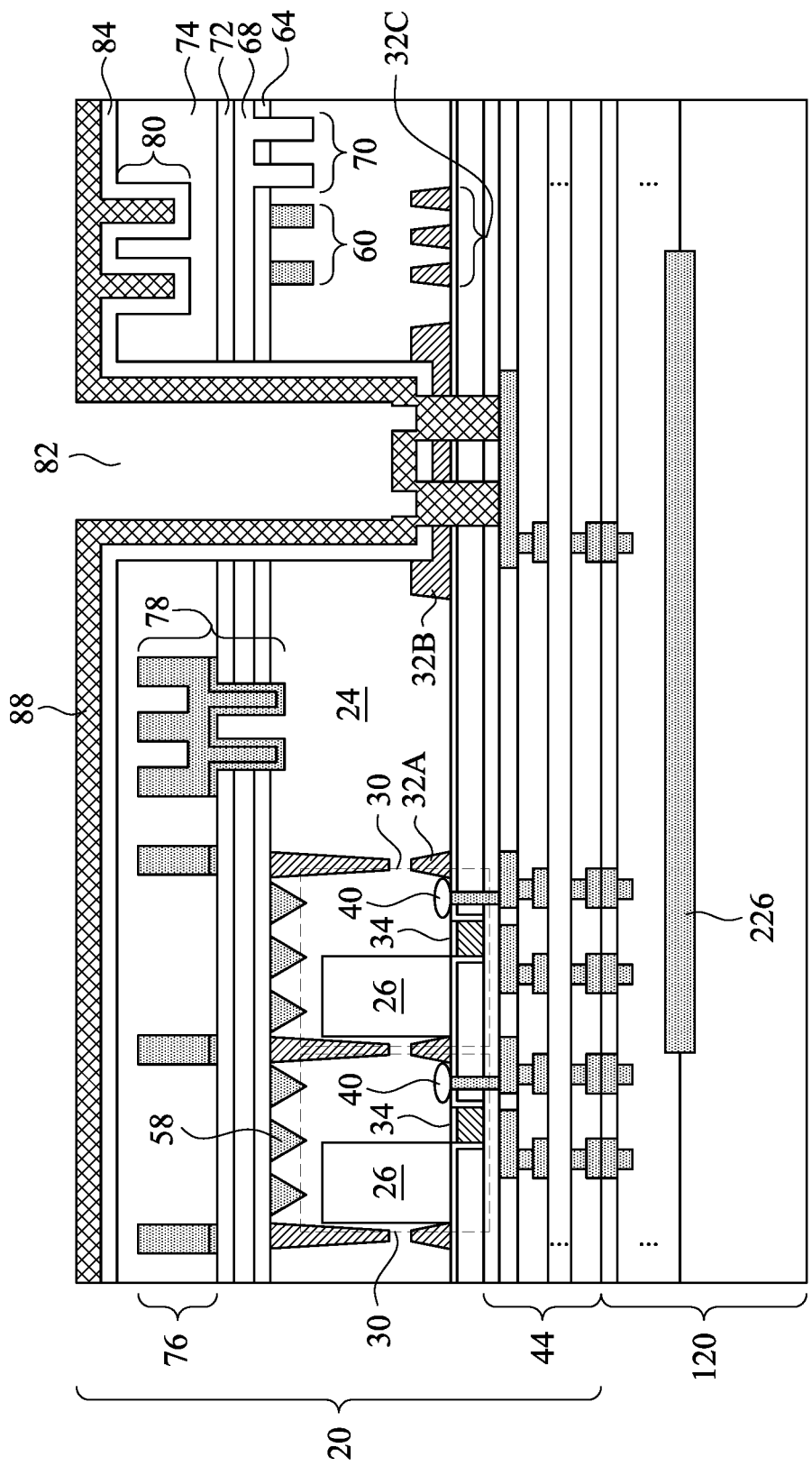

FIG. 14 illustrates the deposition of metal layer 88. The respective process is illustrated as process 232 in the process flow shown in FIG. 21. In accordance with some embodiments of the present disclosure, metal layer 88 is formed of or comprises copper, AlCu, or the like. The thickness of metal layer 88 may be in the range between about 1 µm and about 1.5 µm. The formation method may include, for example, PVD, CVD, or like methods.

Figure 15:
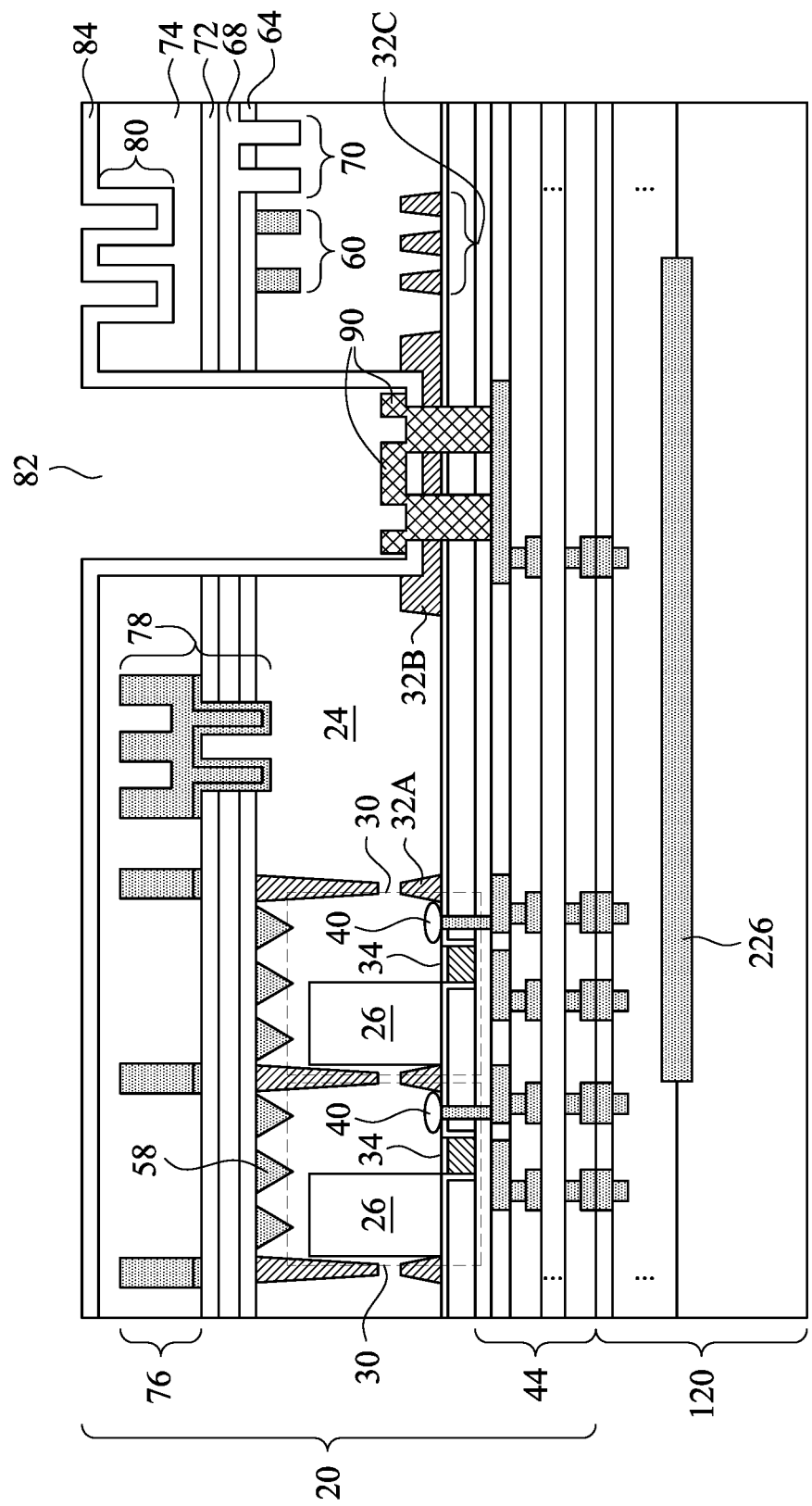

Next, as shown in FIG. 15, metal layer 88 is patterned to form metal pad 90, which includes at least a portion in opening 82. The respective process is illustrated as process 234 in the process flow shown in FIG. 21. The patterning of metal layer 88 may be performed using alignment mark 80, alignment mark 70, or alignment mark 60 to determine its position.

Figure 16:
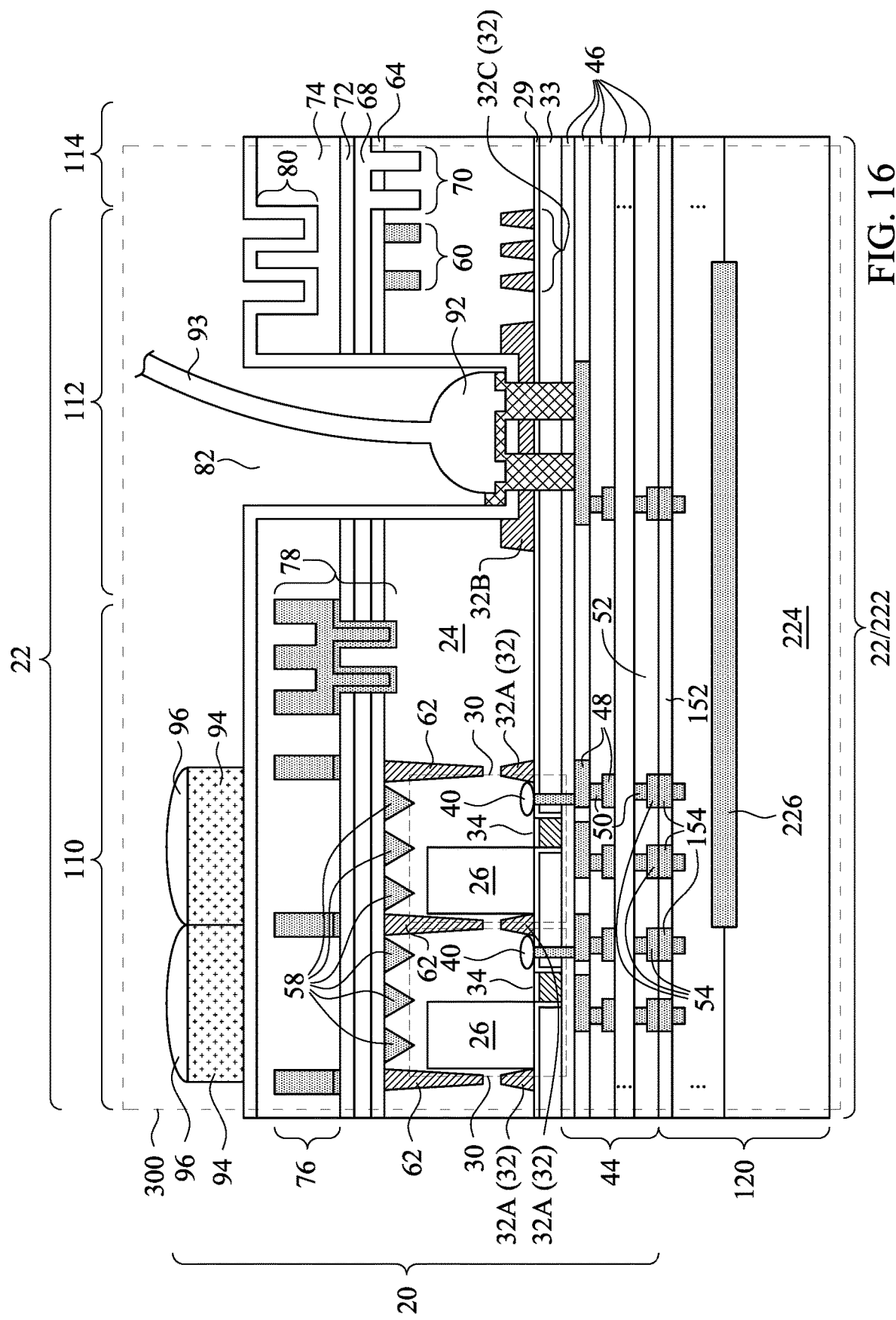

In subsequent processes, as shown in FIG. 16, additional components such as color filters 94 are formed. Micro-lenses 96 are then formed. Each of image sensors 26 is aligned to one of color filters 94 and one of micro-lenses 96. The formation of color filters 94 and micro-lenses 96 may be aligned to alignment mark 60, 70, or 80. Image sensor chip 22 (and corresponding wafer 20) is thus formed. There may be a protection layer (not shown) formed on the micro-lenses 96, for example, by depositing a conformal silicon oxide layer. In subsequent processes, image sensor wafer 20 and wafer 120 are sawed into image sensor chips 22 and device chips 222. An image sensor chip 22 and its bonding device chip 222 are collectively referred to as package 300. Depending on where the alignment marks 60, 70, and/or 80 are formed, the alignment marks 60, 70, and/or 80 may be left in the image sensor chips 22, or may be removed (for example, if the alignment marks are formed in scribe line region 114 (FIG. 18)). When the package 300 is packaged, a wire-bonding process may be performed to form bond ball 92 on metal pad 90, with bond wire 93 attached to bond ball 92.

The preceding processes illustrate the formation of backside alignment marks 60, 70, and 80 as some examples, which are formed at different stages in the formation of the backside structure. In accordance with other embodiments, the backside alignment marks may be formed at any other stage such as after the formation of dielectric layers 68 and/or 72. In accordance with some embodiments of the present disclosure, any one, two, or all three of alignment marks 60, 70, and 80 are formed in any combination, providing that when the first one of the backside alignment marks 60, 70, and 80 is formed, the front-side alignment mark 32C is still visible clearly from the back side of image sensor chip 22. The later-formed alignment marks 60, 70, and 80 may be, or may not be, formed using the earlier formed alignment marks 60, 70, and 80 as alignment marks.

In the preceding examples, alignment marks are illustrated as filled with a single material of the immediately overlying layer. It is appreciated that depending on the depths and the widths of the trenches for forming the alignment marks, the trenches may be or may not be fully filled by one subsequently deposited layer. When they are not fully filled, they will be filled by the subsequently deposited materials.

Figure 20:
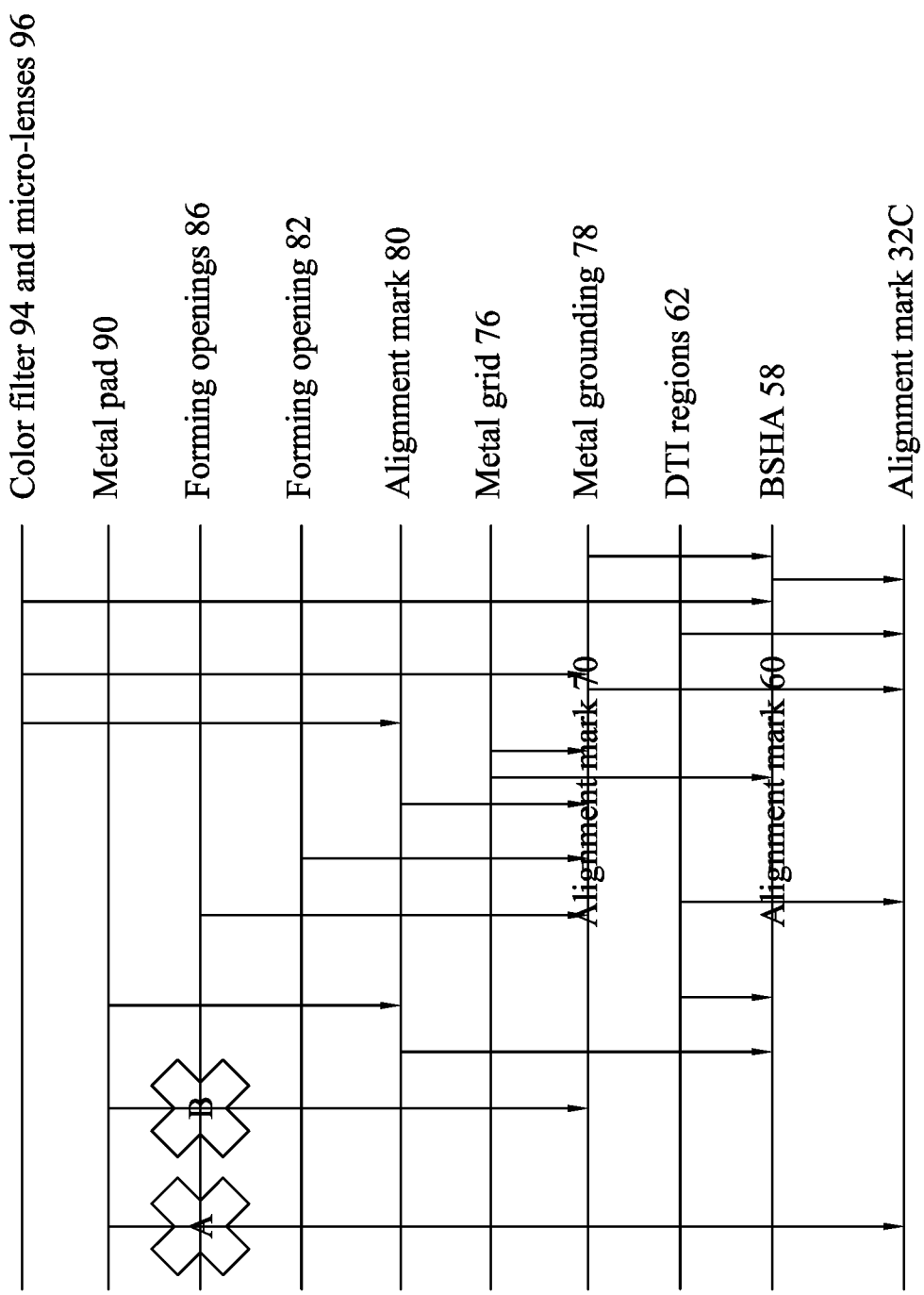
FIG. 20 illustrates alignment marks and the processes that may use the alignment marks in accordance with some embodiments.

FIG. 20 illustrates example embodiments of the time points at which alignment marks are formed, and the example formation processes of the features that may use the preceding-formed alignment marks for alignment. The horizontal straight lines represent the processes and features, and the processes and features at lower positions are performed/formed earlier than the processes and features shown at upper positions. The cross marked with letter "A" represents that at the stage for forming openings 86, the underlying dielectric layers and semiconductor substrate 24 in combination may have a total thickness that is too large for aligning to alignment mark 32C. The cross marked with letter "B" represents that at the stage for forming openings 86, the underlying dielectric layers and semiconductor substrate in combination may have a total thickness that is too large for aligning to alignment marks 60 and 70. Accordingly, alignment marks 60, 70, and/or 80 are formed to provide additional alignment, so that the backside features may be aligned to the earlier-formed backside alignment marks, which are further aligned to the front-side alignment marks. The arrows without crosses represent the possible aligning actions, wherein the starting points of the arrows represent the actions being taken or the features being formed, and the ending points represent the alignment marks that are used. As shown in FIG. 20, due to the increased thickness with the formation of more backside features, the alignment may need to be made using the later-formed backside alignment marks rather than the earlier-formed backside alignment marks. For example, the formation of metal pad 90 may need to be performed using alignment mark 80, while alignment marks 60 and/or 70 may be or may not be usable.

In the discussed embodiments as illustrated, backside alignment marks are formed by aligning to the front-side alignment marks. In accordance with other embodiments, backside features may be formed first, and then front-side features are formed, and the front-side alignment marks may be formed by aligning to the backside alignment marks.

In accordance with some embodiments of the present disclosure, as shown in FIG. 20, alignment mark 80 may be formed by aligning to alignment mark 70 or 60. Metal grid 76 may be formed by aligning to alignment mark 70 or 60, and DTI regions 62 may be formed by aligning to alignment mark 60 or alignment mark 32C. BSHA regions 58 may be formed by aligning to alignment mark 32C.

The embodiments of the present disclosure have some advantageous features. In order to improve the efficiency in collecting light by image sensors, the semiconductor substrate of the image sensors may be left to be thick (for example, thicker than about 6 µm) after the backside grinding process. This causes alignment problems for aligning backside features to the front-side alignment marks. In accordance with some embodiments of the present disclosure, by forming alignment marks on the backside of BSI image sensor chips, better alignment may be achieved. Also, more alignment marks may be formed on the backside of the BSI image sensor chips, so that the alignment may be performed well with the proceeding of the formation of the backside structure of the BSI image sensor chips.

In accordance with some embodiments of the present disclosure, a method comprises forming image sensors in a semiconductor substrate, wherein a first alignment mark is formed close to a front side of the semiconductor substrate; performing a backside polishing process to thin the semiconductor substrate; forming a second alignment mark on the backside of the semiconductor substrate; and forming a feature on the backside of the semiconductor substrate, wherein the feature is formed using the second alignment mark for alignment. In an embodiment, the forming the second alignment mark comprises etching the semiconductor substrate to form trenches extending from the backside of the semiconductor substrate into the semiconductor substrate. In an embodiment, the forming the second alignment mark comprises depositing a dielectric layer to fill the trenches. In an embodiment, the method further comprises, before the semiconductor substrate is etched, depositing an additional dielectric layer contacting a back surface of the semiconductor substrate, wherein the trenches penetrate through the additional dielectric layer. In an embodiment, the method further comprises forming deep trench isolation regions extending from a back surface of the semiconductor substrate into the semiconductor substrate, wherein the second alignment mark is formed before the deep trench isolation regions are formed. In an embodiment, the method further comprises forming a metal grid on the backside of the semiconductor substrate; and depositing a dielectric layer on the metal grid, wherein the forming the second alignment mark comprises etching the dielectric layer to form trenches. In an embodiment, the trenches have a depth smaller than a thickness of the dielectric layer. In an embodiment, the forming the feature comprises etching the semiconductor substrate to form a through-opening penetrating through the semiconductor substrate; and forming a bond pad extending into the through-opening, wherein the bond pad is electrically connected to a metal feature on a front-side of the semiconductor substrate.

In accordance with some embodiments of the present disclosure, a structure comprises a BSI image sensor chip, which comprises a semiconductor substrate; image sensors in the semiconductor substrate; a first alignment mark extending from a front side of the semiconductor substrate into the semiconductor substrate; and a second alignment mark on a backside of the semiconductor substrate. In an embodiment, the first alignment mark is formed of shallow trench isolation regions. In an embodiment, the second alignment mark is formed of dielectric regions, and the dielectric regions extend from a back surface of the semiconductor substrate into the semiconductor substrate. In an embodiment, an entirety of the second alignment mark is in the semiconductor substrate. In an embodiment, a dielectric layer contacting the back surface of the semiconductor substrate, wherein the second alignment mark penetrates through the dielectric layer. In an embodiment, the structure further comprises a metal grid on the backside of the semiconductor substrate; a dielectric layer on the metal grid and filling spaces in the metal grid; and a third alignment mark extending into the dielectric layer. In an embodiment, the structure further comprises a device die bonded to the front side of the BSI image sensor chip.

In accordance with some embodiments of the present disclosure, a structure comprises a BSI image sensor chip, which comprises a semiconductor substrate; image sensors in the semiconductor substrate; a first alignment mark extending from a front surface of the semiconductor substrate into the semiconductor substrate, wherein the first alignment mark comprises patterns of shallow trench isolation regions; and a second alignment mark extending from a back surface of the semiconductor substrate into the semiconductor substrate, wherein at least a part of the second alignment mark is in the semiconductor substrate. In an embodiment, an entirety of the second alignment mark is in the semiconductor substrate. In an embodiment, the second alignment mark comprises a first part in the semiconductor substrate; and a second part outside of the semiconductor substrate. In an embodiment, the second alignment mark is formed of a dielectric material. In an embodiment, the structure further comprises a metal grid on a backside of the semiconductor substrate; a dielectric layer on the metal grid and filling spaces in the metal grid; and a third alignment mark extending into the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming image sensors in a semiconductor substrate, wherein a first alignment mark is formed close to a front side of the semiconductor substrate;
   forming a second alignment mark from a backside of the semiconductor substrate, wherein the forming the second alignment mark comprises:
     etching the semiconductor substrate to form trenches; and
     filling the trenches with a dielectric material;
   forming a third alignment mark extending into the semiconductor substrate, wherein the third alignment mark is formed using the second alignment mark for aligning;
   forming deep trench isolation regions extending from a back surface of the semiconductor substrate into the semiconductor substrate; and
   forming a feature on the backside of the semiconductor substrate, wherein the feature is formed using the second alignment mark for alignment.

2. The method of claim 1, wherein the forming the second alignment mark further comprises:
   performing a planarization process to level a surface of the dielectric material with the back surface of the semiconductor substrate.

3. The method of claim 1 further comprising depositing a dielectric layer contacting the back surface of the semiconductor substrate, wherein the third alignment mark extends into the dielectric layer.

4. The method of claim 1 further comprising:
   forming a metal grid on the backside of the semiconductor substrate;
   depositing a dielectric layer on the metal grid; and
   forming a fourth alignment mark, wherein the forming the fourth alignment mark comprises etching the dielectric layer to form additional trenches, and filling the additional trenches.

5. The method of claim 4, wherein the trenches have a depth smaller than a thickness of the dielectric layer.

6. The method of claim 1 further comprising forming backside high-absorption regions extending into the semiconductor substrate, wherein the backside high-absorption regions comprise:

etching the semiconductor substrate to form openings having triangular cross-sectional view shapes; and filling the openings with the dielectric material, wherein the openings and the trenches are filled in a same filling process.

7. The method of claim 1, wherein the forming the feature comprises:

etching the semiconductor substrate to form a through-opening penetrating through the semiconductor substrate; and forming a bond pad extending into the through-opening, wherein the bond pad is electrically connected to a metal feature on a front-side of the semiconductor substrate.

8. A method comprising:

forming Shallow Trench Isolation (STI) regions in a semiconductor substrate, wherein the STI regions comprise a first alignment mark;

forming image sensors in the semiconductor substrate;

forming a dielectric layer on a back surface of the semiconductor substrate;

forming a second alignment mark in the semiconductor substrate, wherein the second alignment mark comprises dielectric features, and wherein the second alignment mark is formed by aligning to the first alignment mark;

forming a third alignment mark extending into the dielectric layer and the semiconductor substrate, wherein the third alignment mark is formed using the second alignment mark for aligning;

forming a conductive feature on a backside of the semiconductor substrate, wherein the conductive feature is formed using the second alignment mark for aligning; and forming color filters on the backside of the semiconductor substrate.

9. The method of claim 8, wherein the forming the second alignment mark comprises performing a planarization process, so that a surface of the second alignment mark is coplanar with a surface of the semiconductor substrate.

10. The method of claim 9 further comprising forming backside high-absorption regions extending into the semiconductor substrate, wherein the forming the backside high-absorption regions and the forming the second alignment mark comprise a same dielectric-filling process.

11. The method of claim 8, wherein at a time the color filters are formed, the dielectric layer covers an image sensor in the semiconductor substrate.

12. The method of claim 8, wherein the second alignment mark comprises silicon oxide.

13. The method of claim 8, wherein the color filters are formed by using the second alignment mark for aligning.

14. The method of claim 8 further comprising etching the semiconductor substrate to reveal an STI pad in the STI regions.

15. The method of claim 14 further comprising etching the STI pad to form openings extending through the STI pad.

16. A method comprising:

forming a first alignment mark extending into a semiconductor substrate from a front side of the semiconductor substrate;

forming image sensors in the semiconductor substrate;

etching the semiconductor substrate from a backside of the semiconductor substrate to form a trench; and filling an entirety of the trench with a homogeneous dielectric material to form at least a part of a second alignment mark, wherein the second alignment mark is formed by aligning to the first alignment mark, and the forming the second alignment mark comprises:

etching the semiconductor substrate from the backside of the semiconductor substrate to form trenches; and filling the trenches with a dielectric material.

17. The method of claim 16 further comprising forming a third alignment mark extending into the semiconductor substrate from the backside of the semiconductor substrate.

18. The method of claim 17, wherein the third alignment mark comprises a first portion in the semiconductor substrate, and a second portion outside of the semiconductor substrate.

19. The method of claim 1, wherein the third alignment mark is formed on the backside of the semiconductor substrate.

20. The method of claim 8, wherein the second alignment mark is formed on the backside of the semiconductor substrate.

* * * * *